(12) United States Patent
Tervo et al.

(10) Patent No.: US 10,841,018 B2
(45) Date of Patent: Nov. 17, 2020

(54) COMMUNICATION SYSTEM

(71) Applicant: NOKIA TECHNOLOGIES OY, Espoo (FI)

(72) Inventors: Nuutti Tervo, Oulu (FI); Marko Leinonen, Oulu (FI); Aarno Tapio Pärssinen, Espoo (FI)

(73) Assignee: NOKIA TECHNOLOGIES OY, Espoo (FI)

( * ) Notice: Subject to any disclaimer, the term of this patent is extended or adjusted under 35 U.S.C. 154(b) by 0 days.

(21) Appl. No.: 16/594,582

(22) Filed: Oct. 7, 2019

(65) Prior Publication Data

US 2020/0169332 A1    May 28, 2020

(30) Foreign Application Priority Data

Nov. 26, 2018 (GB) .................................. 1819202.1

(51) Int. Cl.
*H03F 1/32* (2006.01)
*H04B 17/12* (2015.01)
(Continued)

(52) U.S. Cl.
CPC .......... *H04B 17/12* (2015.01); *H04B 1/0475* (2013.01); *H04B 7/0617* (2013.01);
(Continued)

(58) Field of Classification Search
USPC ........................................................ 375/297
See application file for complete search history.

(56) References Cited

U.S. PATENT DOCUMENTS

| 9,762,302 B1* | 9/2017 | Shaked | ................ H04B 7/0456 |
| 2008/0130788 A1* | 6/2008 | Copeland | .............. H03F 1/3247 375/297 |

(Continued)

FOREIGN PATENT DOCUMENTS

| CN | 102035076 A | 4/2011 |
| EP | 2 415 167 B1 | 10/2017 |

(Continued)

OTHER PUBLICATIONS

Combined Search and Examination Report under Sections 17 and 18(3) dated May 8, 2019 corresponding to GB1819202.1.

(Continued)

*Primary Examiner* — Eva Y Puente
(74) *Attorney, Agent, or Firm* — Squire Patton Boggs (US) LLP

(57) ABSTRACT

An apparatus comprising means for: applying beam shape coefficients for obtaining a beam shape output for a linear part of the beam formed by an array of transmitters, each transmitter being associated with a respective transmit path comprising a respective power amplifier; varying the output characteristics of at least one transmit path to increase nonlinear characteristics between the transmit paths to provide a beam shape for a non-linear part of the beam; linearizing the output of the array by: determining linearization coefficients for the array for digitally predistorting the input signal to the array; and applying the linearization coefficients to the signal input to the array; and calibrating the transmitter array by: measuring error distributions over at least two transmit paths; modifying the beam shape coefficients to better obtain the beam shapes subsequent to the linearization; and applying the modified beam shape coefficients to the array of transmitters.

15 Claims, 18 Drawing Sheets

(51) Int. Cl.
  *H04B 17/10* (2015.01)
  *H04B 1/04* (2006.01)
  *H04B 7/06* (2006.01)

(52) U.S. Cl.
  CPC ......... *H04B 17/104* (2015.01); *H03F 1/3247* (2013.01); *H04B 2001/0425* (2013.01)

(56) References Cited

U.S. PATENT DOCUMENTS

| | | |
|---|---|---|
| 2013/0163696 A1 | 6/2013 | Son et al. |
| 2019/0058530 A1* | 2/2019 | Rainish ................. H04B 17/26 |
| 2019/0089389 A1* | 3/2019 | Gutman ................ H03F 1/3247 |
| 2019/0131934 A1* | 5/2019 | Khalil ..................... H03F 3/24 |
| 2019/0312613 A1* | 10/2019 | Guan ................... H04B 17/102 |
| 2020/0028476 A1* | 1/2020 | Kim ......................... H03F 3/68 |

FOREIGN PATENT DOCUMENTS

| | | |
|---|---|---|
| EP | 3267579 A1 | 1/2018 |
| EP | 3 334 052 A1 | 6/2018 |
| WO | WO 2010/008968 A1 | 1/2010 |
| WO | WO 2010/038227 A2 | 4/2010 |

OTHER PUBLICATIONS

Tervo Nuutti et al.: "Digital predistortion of amplitude varying phased array utilising over-the-air combining", 2017 IEEE MTT-S International Microwave Symposium (IMS), IEEE, Jun. 4, 2017, pp. 1165-1168.

Mar. 24, 2020 Extended Search Report issued in European Patent Application No. 19211639.0.

* cited by examiner

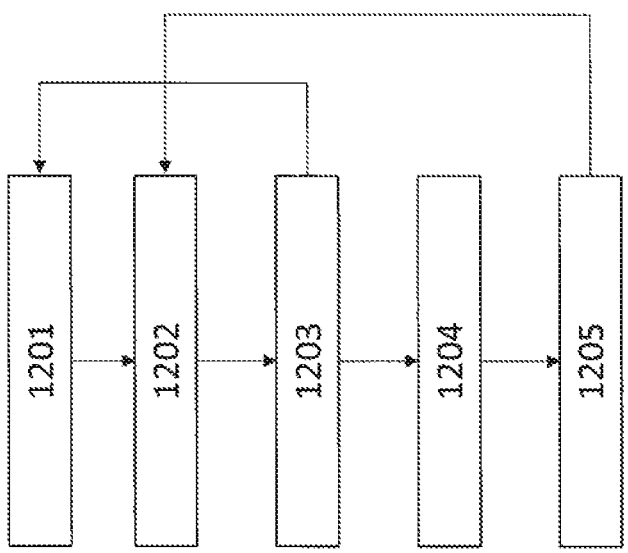

COMMUNICATION SYSTEM

FIELD

The present application relates to a method, apparatus, and computer program.

BACKGROUND

A communication system can be seen as a facility that enables communication sessions between two or more entities such as user terminals, base stations/access points and/or other nodes by providing carriers between the various entities involved in the communications path. A communication system can be provided, for example, by means of a communication network and one or more compatible communication devices. The communication sessions may comprise, for example, communication of data for carrying communications such as voice, electronic mail (email), text message, multimedia and/or content data and so on. Non-limiting examples of services provided comprise two-way or multi-way calls, data communication or multimedia services and access to a data network system, such as the Internet.

SUMMARY

According to a first aspect, there is provided an apparatus comprising means for: applying beam shape coefficients for obtaining a beam shape output for a linear part of the beam formed by an array of transmitters, each transmitter being associated with a respective transmit path comprising a respective power amplifier; varying the output characteristics of at least one transmit path to increase nonlinear characteristics between the transmit paths to provide a beam shape for a non-linear part of the beam; linearizing the output of the array by: determining linearization coefficients for the array for digitally predistorting the input signal to the array; and applying the linearization coefficients to the signal input to the array; and calibrating the transmitter array by: measuring error distributions over at least two transmit paths; modifying the beam shape coefficients to better obtain the beam shapes subsequent to the linearization; and applying the modified beam shape coefficients to the array of transmitters.

The apparatus may further comprise means for alternating between the means for linearizing and the means for calibrating until the beam shape, having a mixture of linear and non-linear components, is obtained.

Measuring the error distribution over at least two transmit paths may comprise measuring any of: a power distribution, an amplitude distribution, and/or an envelope distribution over the at least two transmit paths.

Determining the linearization coefficients may comprise obtaining time domain samples of the signals output by the array.

The apparatus may further comprise means for: comparing the measured error distributions to a threshold value; and alternating between said means for linearizing and said means for calibrating while the measured error distributions are above the threshold value.

The apparatus may further comprise means for: comparing the measured error distributions to a threshold value; and operating the means for calibrating when the measured error distributions are above the threshold value; and operating the means for linearizing when the measured error distributions are below the threshold value.

The apparatus may further comprise means for: providing the linearization coefficients to the means for calibrating; and using the linearization coefficients for modifying the beam shape coefficients.

The apparatus may further comprise means for altering the beam shape during the operation of the apparatus based on at least one of: differences in nonlinearities between nonlinear transmit paths; interference level surrounding the apparatus; received signal power levels; movement of the apparatus relative to other apparatuses with which the apparatus is communicating; a determined quality level of a received signal; a direction of interference in a communicated signal; a direction of transmission or convergence speed associated with linearizing the output of the array; and a direction of transmission or convergence speed associated with calibrating the transmitter array.

The apparatus may further comprise means for determining the non-linear part of the beam by calculating any of: an adjacent channel power; a total radiated adjacent channel power; a signal to noise ratio; and a signal to interference ratio.

The means for modifying the nonlinear characteristics between the transmit paths may be configured to modify the nonlinear characteristics by least one of: altering the phase of a phase shifter in at least one transmit path; altering the gain of a variable gain amplifier in at least one transmit path; and biasing of a power amplifier in at least one transmit path.

According to a second aspect, there is provided a method comprising: applying beam shape coefficients for obtaining a beam shape output for a linear part of the beam formed by an array of transmitters, each transmitter being associated with a respective transmit path comprising a respective power amplifier; varying the output characteristics of at least one transmit path to increase nonlinear characteristics between the transmit paths to provide a beam shape for a non-linear part of the beam; linearizing the output of the array by: determining linearization coefficients for the array for digitally predistorting the input signal to the array; and applying the linearization coefficients to the signal input to the array; and calibrating the transmitter array by: measuring error distributions over at least two transmit paths; modifying the beam shape coefficients to better obtain the beam shapes subsequent to the linearization; and applying the modified beam shape coefficients to the array of transmitters.

The method may further comprise alternating between the linearizing and the calibrating until the beam shape, having a mixture of linear and non-linear components, is obtained.

Measuring the error distribution over at least two transmit paths may comprise measuring any of: a power distribution, an amplitude distribution, and/or an envelope distribution over the at least two transmit paths.

Determining the linearization coefficients may comprise obtaining time domain samples of the signals output by the array.

The method may further comprise: comparing the measured error distributions to a threshold value; and alternating between said linearizing and said calibrating while the measured error distributions are above the threshold value.

The method may further comprise: comparing the measured error distributions to a threshold value; and operating the calibrating when the measured error distributions are above the threshold value; and operating the linearizing when the measured error distributions are below the threshold value.

The method may further comprise: providing the linearization coefficients to an apparatus performing the calibrating; and using the linearization coefficients for modifying the beam shape coefficients.

The method may further comprise altering the beam shape during the operation of the apparatus based on at least one of: differences in nonlinearities between nonlinear transmit paths; interference level surrounding the apparatus; received signal power levels; movement of the apparatus relative to other apparatuses with which the apparatus is communicating; a determined quality level of a received signal; a direction of interference in a communicated signal; a direction of transmission or convergence speed associated with linearizing the output of the array; and a direction of transmission or convergence speed associated with calibrating the transmitter array.

The method may further comprise determining the non-linear part of the beam by calculating any of: an adjacent channel power; a total radiated adjacent channel power; a signal to noise ratio; and a signal to interference ratio.

The modifying the nonlinear characteristics between the transmit paths may comprise modifying the nonlinear characteristics by least one of: altering the phase of a phase shifter in at least one transmit path; altering the gain of a variable gain amplifier in at least one transmit path; and biasing of a power amplifier in at least one transmit path.

According to a third aspect there is provided a computer program comprising instructions for causing an apparatus to perform at least: applying beam shape coefficients for obtaining a beam shape output for a linear part of the beam formed by an array of transmitters, each transmitter being associated with a respective transmit path comprising a respective power amplifier; varying the output characteristics of at least one transmit path to increase nonlinear characteristics between the transmit paths to provide a beam shape for a non-linear part of the beam; linearizing the output of the array by: determining linearization coefficients for the array for digitally predistorting the input signal to the array; and applying the linearization coefficients to the signal input to the array; and calibrating the transmitter array by: measuring error distributions over at least two transmit paths; modifying the beam shape coefficients to better obtain the beam shapes subsequent to the linearization; and applying the modified beam shape coefficients to the array of transmitters.

The instructions may further cause the apparatus to perform alternating between the linearizing and the calibrating until the beam shape, having a mixture of linear and non-linear components, is obtained.

Measuring the error distribution over at least two transmit paths may comprise measuring any of: a power distribution, an amplitude distribution, and/or an envelope distribution over the at least two transmit paths.

Determining the linearization coefficients may comprise obtaining time domain samples of the signals output by the array.

The instructions may further cause the apparatus to perform: comparing the measured error distributions to a threshold value; and alternating between said linearizing and said calibrating while the measured error distributions are above the threshold value.

The instructions may further cause the apparatus to perform: comparing the measured error distributions to a threshold value; and operating the calibrating when the measured error distributions are above the threshold value; and operating the linearizing when the measured error distributions are below the threshold value.

The instructions may further cause the apparatus to perform: providing the linearization coefficients to an apparatus performing the calibrating; and using the linearization coefficients for modifying the beam shape coefficients.

The instructions may further cause the apparatus to perform altering the beam shape during the operation of the apparatus based on at least one of: differences in nonlinearities between nonlinear transmit paths; interference level surrounding the apparatus; received signal power levels; movement of the apparatus relative to other apparatuses with which the apparatus is communicating; a determined quality level of a received signal; a direction of interference in a communicated signal; a direction of transmission or convergence speed associated with linearizing the output of the array; and a direction of transmission or convergence speed associated with calibrating the transmitter array.

The instructions may further cause the apparatus to perform determining the non-linear part of the beam by calculating any of: an adjacent channel power; a total radiated adjacent channel power; a signal to noise ratio; and a signal to interference ratio.

The modifying the nonlinear characteristics between the transmit paths may comprise modifying the nonlinear characteristics by least one of: altering the phase of a phase shifter in at least one transmit path; altering the gain of a variable gain amplifier in at least one transmit path; and biasing of a power amplifier in at least one transmit path.

According to a fifth aspect there is provided a non-transitory computer readable medium comprising program instructions for causing an apparatus to perform at least the following: apply beam shape coefficients for obtaining a beam shape output for a linear part of the beam formed by an array of transmitters, each transmitter being associated with a respective transmit path comprising a respective power amplifier; vary the output characteristics of at least one transmit path to increase nonlinear characteristics between the transmit paths to provide a beam shape for a non-linear part of the beam; linearize the output of the array by: determining linearization coefficients for the array for digitally predistorting the input signal to the array; and applying the linearization coefficients to the signal input to the array; and calibrate the transmitter array by: measuring error distributions over at least two transmit paths; modifying the beam shape coefficients to better obtain the beam shapes subsequent to the linearization; and applying the modified beam shape coefficients to the array of transmitters.

In an example, the non-transitory computer readable medium may comprise instructions for causing an apparatus to perform at least any of the steps of the examples described between the above-mentioned second aspect.

According to a sixth aspect, there is provided an apparatus comprising at least one processor, and at least one memory including computer program code, wherein the at least one memory and the computer program code are configured, with the at least one processor, to cause the apparatus to: apply beam shape coefficients for obtaining a beam shape output for a linear part of the beam formed by an array of transmitters, each transmitter being associated with a respective transmit path comprising a respective power amplifier; vary the output characteristics of at least one transmit path to increase nonlinear characteristics between the transmit paths to provide a beam shape for a non-linear part of the beam; linearize the output of the array by: determining linearization coefficients for the array for digitally predistorting the input signal to the array; and applying the linearization coefficients to the signal input to the array; and calibrate the transmitter array by: measuring error distributions over at least two transmit paths; modifying the beam shape coefficients to better obtain the beam shapes subsequent to the linearization; and applying the modified beam shape coefficients to the array of transmitters.

The apparatus may be further caused to: alternate between the linearizing and the calibrating until the beam shape, having a mixture of linear and non-linear components, is obtained.

Measuring the error distribution over at least two transmit paths may comprise measuring any of: a power distribution, an amplitude distribution, and/or an envelope distribution over the at least two transmit paths.

Determining the linearization coefficients may comprise obtaining time domain samples of the signals output by the array.

The apparatus may be further caused to: compare the measured error distributions to a threshold value; and alternate between said linearizing and said calibrating while the measured error distributions are above the threshold value.

The apparatus may be further caused to: compare the measured error distributions to a threshold value; and operate the calibrating when the measured error distributions are above the threshold value; and operate the linearizing when the measured error distributions are below the threshold value.

The apparatus may be further caused to: provide the linearization coefficients to an apparatus performing the calibrating; and use the linearization coefficients for modifying the beam shape coefficients.

The apparatus may be further caused to alter the beam shape during the operation of the apparatus based on at least one of: differences in nonlinearities between nonlinear transmit paths; interference level surrounding the apparatus; received signal power levels; movement of the apparatus relative to other apparatuses with which the apparatus is communicating; a determined quality level of a received signal; a direction of interference in a communicated signal; a direction of transmission or convergence speed associated with linearizing the output of the array; and a direction of transmission or convergence speed associated with calibrating the transmitter array.

The apparatus may be further caused to determine the non-linear part of the beam by calculating any of: an adjacent channel power; a total radiated adjacent channel power; a signal to noise ratio; and a signal to interference ratio.

Modifying the nonlinear characteristics between the transmit paths may comprise modifying the nonlinear characteristics by least one of: altering the phase of a phase shifter in at least one transmit path; altering the gain of a variable gain amplifier in at least one transmit path; and biasing of a power amplifier in at least one transmit path.

DESCRIPTION OF FIGURES

Embodiments will now be described, by way of example only, with reference to the accompanying Figures in which:

FIG. 10 shows a flow chart of combined calibration and linearization process in which the calibration process is repeated until convergence before applying linearization process to improve the stability of the process.

DETAILED DESCRIPTION

The present application relates to controlling linear and nonlinear characteristics of a transmitter array having a plurality of nonlinear paths.

In particular, as a signal is passed through a plurality of power amplifiers, the power amplifier outputs may be combined to form an overall output beam shape. Each power amplifier may have a linear mode of operation and a nonlinear mode of operation, and so the output beam shape may comprise both linear and nonlinear parts. The following proposes that the linear and nonlinear characteristics of such an output beam may be controlled by using a combination of both beam shaping and linearization techniques. In particular, the linear part(s) of the beam may be controlled using a calibration process whilst the non-linear part(s) of the beam may be controlled using linearization techniques, such as digital predistortion.

Before explaining in detail the examples, certain general principles of a wireless communication system and mobile communication devices are briefly explained with reference to FIGS. 1 to 2 to assist in understanding the technology underlying the described examples.

Figure 1:
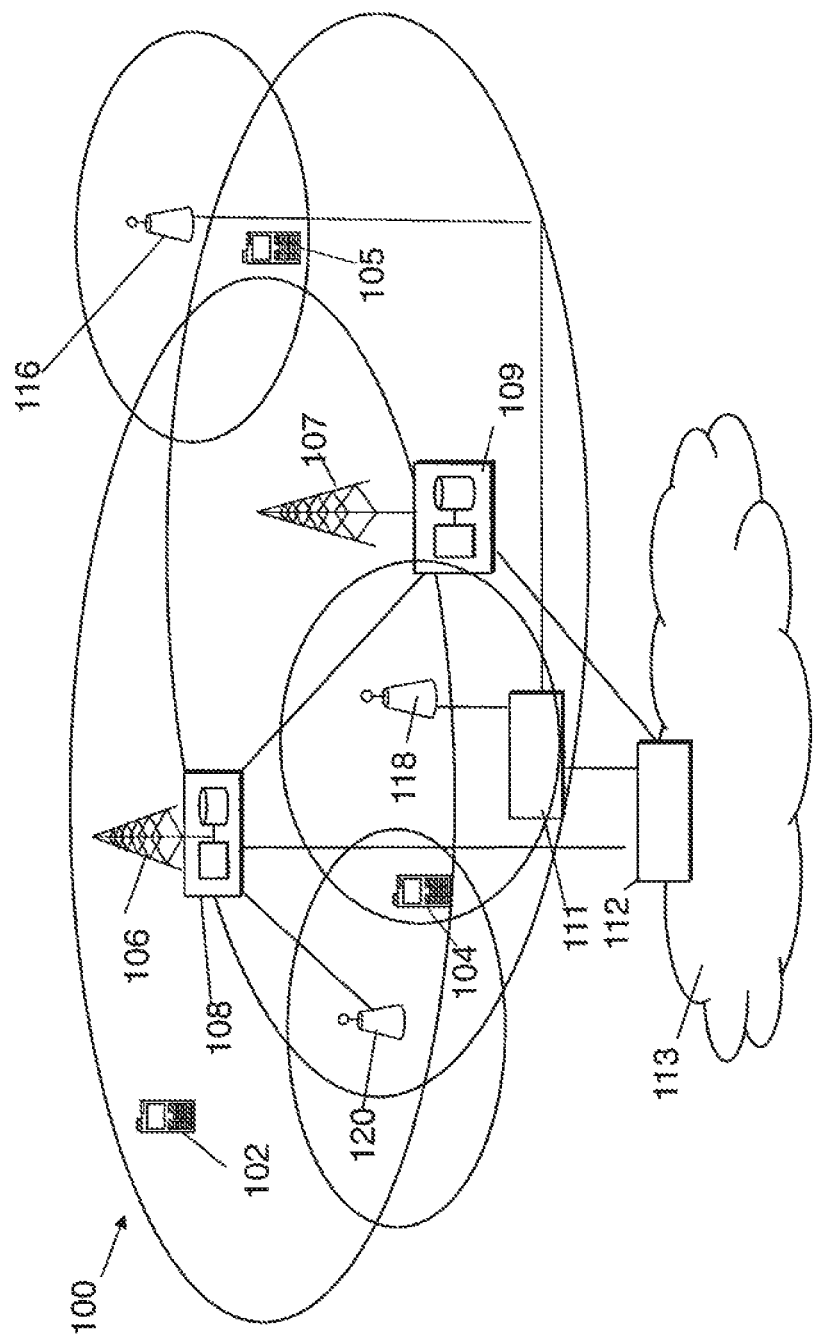
FIG. 1 shows a schematic diagram of an example communication system comprising a plurality of base stations and a plurality of communication devices.

In a wireless communication system 100, such as that shown in FIG. 1, mobile communication devices or user apparatus (UE) 102, 104, 105 are provided wireless access via at least one base station or similar wireless transmitting and/or receiving node or point. A user can access the communication system by means of an appropriate communication device or terminal. A communication device of a user is often referred to as user equipment (UE) or as a user apparatus. Throughout the following, these terms will be used interchangeably. A communication device is provided with an appropriate signal receiving and transmitting apparatus for enabling communications, for example enabling access to a communication network or communications directly with other users. The communication device may access a carrier provided by a station or access point, and transmit and/or receive communications on the carrier.

The communication system and associated devices typically operate in accordance with a given standard or specification which sets out what the various entities associated with the system are permitted to do and how that should be achieved. Communication protocols and/or parameters which shall be used for the connection are also typically defined. One example of a communications system is UTRAN (3G radio). An example of attempts to solve the problems associated with the increased demands for capacity is an architecture that is known as the long-term evolution (LTE) of the Universal Mobile Telecommunications System (UMTS) radio-access technology. LTE is being standardized by the 3rd Generation Partnership Project (3GPP).

A base station is referred to as an eNodeB (eNB) in LTE, and may be referred to more generally as simply a network apparatus or a network access point. Base stations are typically controlled by at least one appropriate controller apparatus, so as to enable operation thereof and management of mobile communication devices in communication with the base stations. The controller apparatus may be located in a radio access network (e.g. wireless communication system 100) or in a core network (CN) (not shown) and may be implemented as one central apparatus or its functionality may be distributed over several apparatus. The controller apparatus may be part of the base station and/or provided by a separate entity such as a Radio Network Controller. In FIG. 1 control apparatus 108 and 109 are shown to control the respective macro level base stations 106 and 107. In some systems, the control apparatus may additionally or alternatively be provided in a radio network controller.

LTE systems may however be considered to have a so-called "flat" architecture, without the provision of RNCs; rather the (e)NB is in communication with a system architecture evolution gateway (SAE-GW) and a mobility management entity (MME), which entities may also be pooled meaning that a plurality of these nodes may serve a plurality (set) of (e)NBs. Each user apparatus is served by only one MME and/or S-GW at a time and the (e) NB keeps track of current association. SAE-GW is a "high-level" user plane core network element in LTE, which may consist of the S-GW and the P-GW (serving gateway and packet data network gateway, respectively). The functionalities of the S-GW and P-GW are separated and they are not required to be co-located.

In an LTE system, radio resource control (RRC) is defined to be a sublayer of radio interface Layer 3 that exists in the control plane only, and which provides information transfer service to the non-access stratum (see 3GPP Technical Specification Group Services and System Aspects 21.905). RRC is a protocol layer between a user apparatus and an eNB, and is in charge of, for example, paging the user apparatus when traffic comes, establishing/maintaining or release of radio bearers (establishing an RRC connection between user apparatus and eNB), user apparatus mobility, user apparatus measurement configuration and user apparatus reporting configuration, etc. RRC is responsible for controlling the configuration of radio interface Layers 1 and 2.

In FIG. 1 base stations 106 and 107 are shown as connected to a wider communications network 113 via gateway 112. A further gateway function may be provided to connect to another network.

The smaller base stations 116, 118 and 120 may also be connected to the network 113, for example by a separate gateway function and/or via the controllers of the macro level stations. The base stations 116, 118 and 120 may be pico or femto level base stations or the like. In the example, base stations 116 and 118 are connected via a gateway 111 whilst station 120 connects via the controller apparatus 108. In some embodiments, the smaller stations may not be provided.

Figure 2:
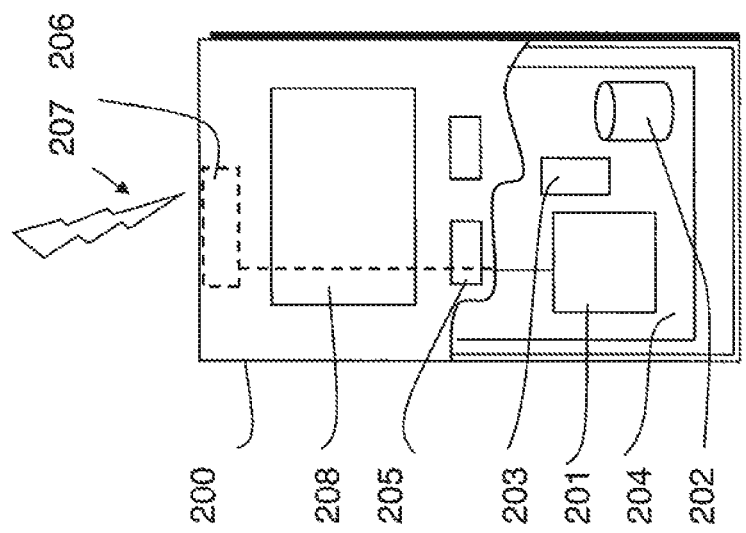
FIG. 2 shows a schematic diagram of an example mobile communication device.

A possible mobile communication device will now be described in more detail with reference to FIG. 2 showing a schematic, partially sectioned view of a communication device 200. Such a communication device is often referred to as user apparatus (UE) or terminal. An appropriate mobile communication device may be provided by any device capable of sending and receiving radio signals. Non-limiting examples comprise a mobile station (MS) or mobile device such as a mobile phone or what is known as a 'smart phone', a computer provided with a wireless interface card or other wireless interface facility (e.g., USB dongle), personal data assistant (PDA) or a tablet provided with wireless communication capabilities, or any combinations of these or the like. A mobile communication device may provide, for example, communication of data for carrying communications such as voice, electronic mail (email), text message, multimedia and so on. Users may thus be offered and provided numerous services via their communication devices. Non-limiting examples of these services comprise two-way or multi-way calls, data communication or multimedia services or simply an access to a data communications network system, such as the Internet. Users may also be provided broadcast or multicast data. Non-limiting examples of the content comprise downloads, television and radio programs, videos, advertisements, various alerts and other information.

The mobile device 200 may receive signals over an air or radio interface 207 via appropriate apparatus for receiving and may transmit signals via appropriate apparatus for transmitting radio signals. In FIG. 2 transceiver apparatus is designated schematically by block 206 for transmitting and receiving signals over the air or radio interface 207. The transceiver apparatus 206 may be provided for example by means of a radio part and associated antenna arrangement. The antenna arrangement may be a single antenna or an antenna array. The antenna arrangement may be arranged internally or externally to the mobile device.

A mobile device is typically provided with at least one data processing entity 201, at least one memory 202 and other possible components 203 for use in software and hardware aided execution of tasks it is designed to perform, including control of access to and communications with access systems and other communication devices. The data processing, storage and other relevant control apparatus can be provided on an appropriate circuit board and/or in chipsets. This feature is denoted by reference 204. The user may control the operation of the mobile device by means of a suitable user interface such as key pad 205, voice commands, touch sensitive screen or pad, combinations thereof or the like. A display 208, a speaker and a microphone can be also provided. Furthermore, a mobile communication device may comprise appropriate connectors (either wired or wireless) to other devices and/or for connecting external accessories, for example hands-free equipment, thereto. The communication devices 102, 104, 105 may access the communication system based on various access techniques.

An example of wireless communication systems are architectures standardized by the 3rd Generation Partnership Project (3GPP). A latest 3GPP based development is often referred to as the long term evolution (LTE) or LTE Advanced Pro of the Universal Mobile Telecommunications System (UMTS) radio-access technology. Other examples of radio access system comprise those provided by base stations of systems that are based on technologies such as wireless local area network (WLAN) and/or WiMax (Worldwide Interoperability for Microwave Access). A base station can provide coverage for an entire cell or similar radio service area.

Figure 3:
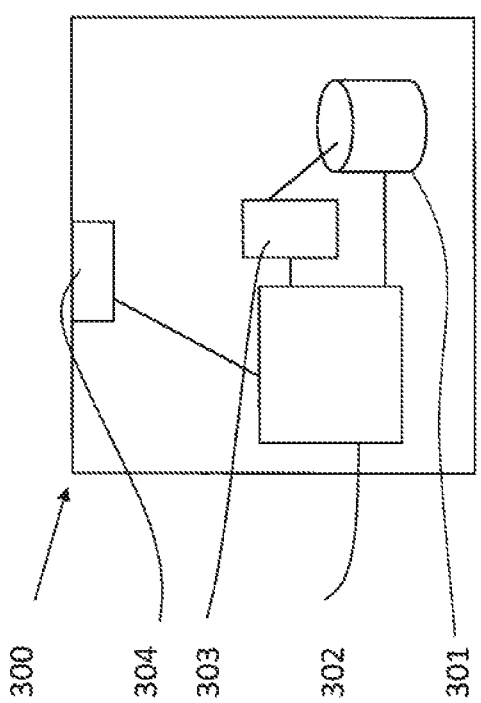
FIG. 3 shows a schematic diagram of an example network element.

An example network equipment for the 3GPP system is shown in FIG. 3. FIG. 3 shows an example of a control apparatus 300 for a communication system, for example to be coupled to and/or for controlling a station of an access system, such as a RAN node, e.g. a base station or (e) node B, or a node of a core network such as an MME. In FIG. 1, these access nodes may be any of 106, 107, 116, 118, 120. The method may be implanted in a single control apparatus or across more than one control apparatus. The control apparatus may be integrated with or external to a node or module of a core network or RAN. In some embodiments, base stations comprise a separate control apparatus unit or module. In other embodiments, the control apparatus can be another network element such as a radio network controller or a spectrum controller. In some embodiments, each base station may have such a control apparatus as well as a control apparatus being provided in a radio network controller. The control apparatus 300 can be arranged to provide control on communications in the service area of the system. The control apparatus 300 comprises at least one memory 301, at least one data processing unit 302, 303 and an input/output interface 304. Via the interface, the control apparatus can be coupled to a receiver and a transmitter of the base station. The receiver and/or the transmitter may be implemented as a radio front end or a remote radio head, and may function in a similar manner to transceiver apparatus 206.

For example the control apparatus 300 can be configured to execute an appropriate software code to provide the control functions. Control apparatus 300 may be included in a chipset or modem apparatus. A chipset or modem apparatus which includes apparatus 300 may be included in a control node such as an eNB (Radio base station).

Communication devices may utilise arrays of antennas when communicating between devices. For example, a transmitter may have an array of transmitter antennas for transmitting a signal to a receiver, whilst a receiver may have an array of receiver antennas for receiving a transmitted signal. The following will focus on transmitter arrays.

A transmitter array of a device is a set of two or more transmitters with respective non-linear signal branches, where the signals from the signal branches of the transmitters are combined or processed to achieve improved performance for the device's transmissions. Each signal path (also referred to herein as a transmitter path) comprises at least one respective power amplifier for increasing the transmission power of a signal being processed on that signal path and a respective antenna for transmitting the signal processed along the signal path. The signal may be transmitted over the air (for example, at radio frequencies or at microwave frequencies). A transmitter array can be used to increase the overall transmission gain, to "steer" a transmission beam into a particular direction, "shape" it to have a certain spatial shape, and/or to maximise a Signal to Interference plus Noise Ratio (SINR).

For steering a beam in a particular direction, phased transmitter arrays may be used. Phased transmitter arrays are transmitter arrays in which the direction of a transmitted beam may be steered electronically, without physically moving the antennas themselves. Instead, a signal is passed to multiple signal branches, each signal branch comprising a phase shifter that electronically alters the phase of the signal in that signal branch. This can be used to direct/steer a beam of radio waves in a particular direction. In addition, the gain of each phased array branch may be controlled e.g. by variable gain amplifiers such that the beam shape can be also varied. In other words, the amplitudes of each phased array branch may be controlled. To practically achieve this, a large number of small antennas are commonly used (sometimes of the orders of thousands of antennas) in order to achieve high gain, phased arrays.

Phased array transmitters are becoming popular for millimetre-wave (mmW) band communications and are the emerging technology towards 5G communication networks. Phased antenna transceivers under 6 GHz frequency range are also emerging as a popular technology for 5G communication network. As 5G networks may require a high data rate of transmissions, this means that the phased arrays should operate in a linear mode to guarantee high-quality communications.

Linearity commonly refers to a property of a power amplifier. In particular, a power amplifier exhibits two operation regions. In a first region, a power amplifier presents linear behaviour (i.e. the output power is proportional to the input power) but operates with a low efficiency (i.e. a low ratio between the output power and the total power consumption). In a second region, a power amplifier presents nonlinear behaviour (i.e. the output power is not proportional to the input power) but operates with a high efficiency (i.e. a high ratio between the output power and the total power consumption). Although a highly linear, highly efficient signal is desired, constraints in power amplifier design may make this difficult to achieve.

One mechanism for obtaining a highly linear, highly efficient signal is to distort the peaks of the communication signals to achieve high efficiency and to compensate later for the non-linear distortion introduced by, for example, predistortion linearization. Predistortion linearization, including digital predistortion, compensates for nonlinear behaviour of power amplifiers by modifying the phase and/or amplitude of each sample of a power amplifier input signal. The predistortion shapes the signal over time or frequency domain samples. This signal modification is performed by analysing the output signal of the power amplifier and generating a complementary nonlinearity to that of the power amplifier to even it out.

Figure 4:
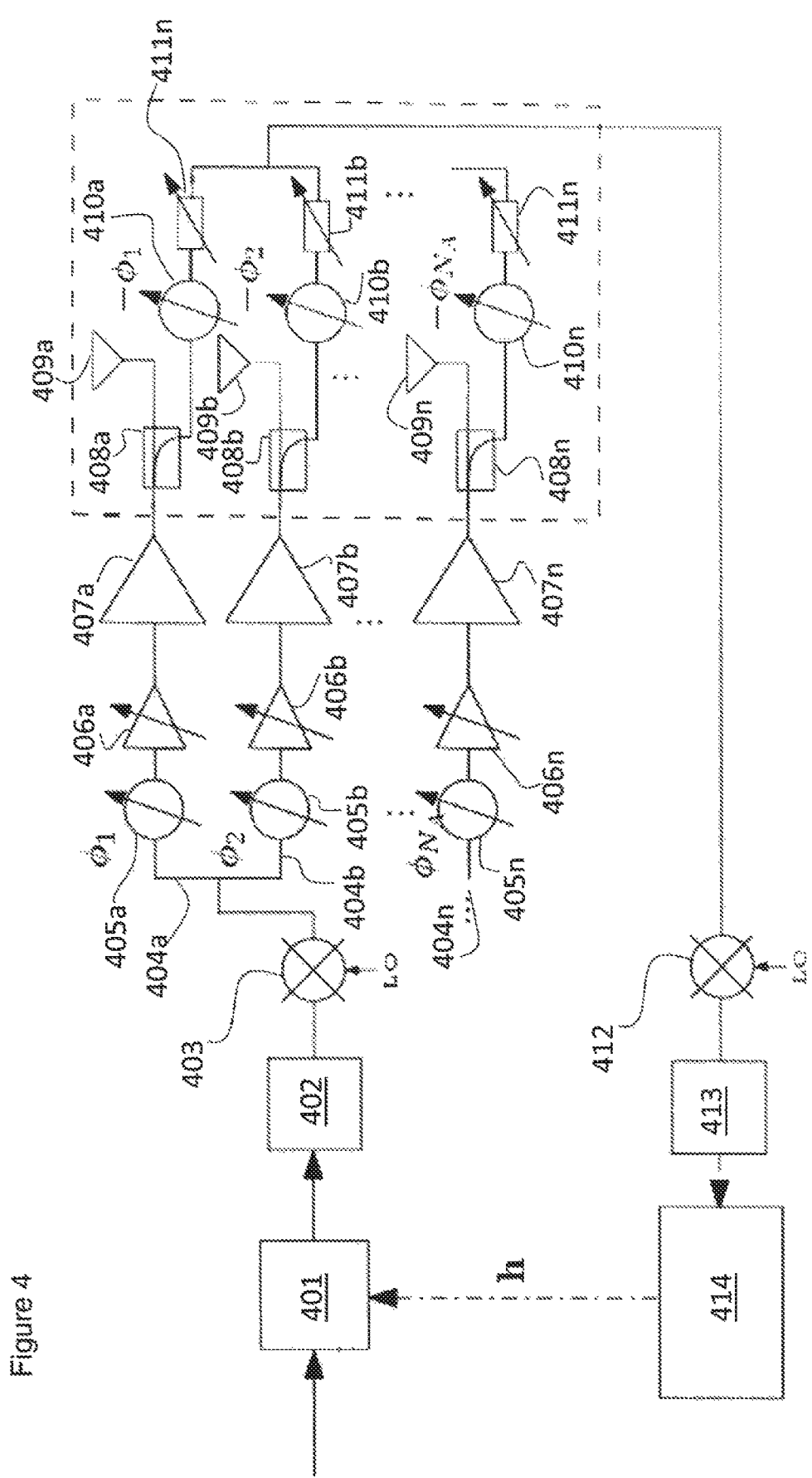
FIG. 4 shows a block diagram of an example system where a single linearizer is applied for a plurality of nonlinear transmit branches.

The following describes techniques for linearizing a signal that were disclosed in earlier filed application GB 1720236.7, with reference to FIGS. 4 to 5.

FIG. 4 illustrates an input waveform being input into a digital predistorter 401. The digital predistorter 401 distorts the input signal based on predistortion coefficients h (discussed later). The digital predistorter 401 outputs the distorted waveform to a digital to analogue converter 402, which converts the signal into analogue to a local oscillator 403. The local oscillator 403 upconverts the signal to a higher frequency and outputs the upconverted signal to a plurality of signal branches 404a, 404b . . . 404n. Each signal branch is non-linear and comprises respective phase shifters 405a, 405b . . . 405n (which apply respective phase shifts in order to control the beam direction), variable gain amplifiers 406a, 406b . . . 406n, power amplifiers 407a, 407b . . . 407n, coupling elements 408a, 408b . . . 408n, which provides a copy of the signal in a branch to a respective antenna 409a, 409b . . . 409n and to feedback circuitry comprising a phase shifter 410a, 410b . . . 410n (which may apply a negative phase shift to that applied by phase shifters 405a, 405b . . . 405n) and a controllable attenuator 411a, 411b . . . 411n to attenuate the signal before a summation. The sum of the outputs from all of these branches is input to a local oscillator 412, which downconverts the summed signal to a lower frequency. The downconverted signal is then input to an analogue to digital converter 413, which converts the downconverted signal into digital representation at a sampling frequency. The digital representation/digital domain samples are then input to a digital predistortion calculator 414, which determines the predistortion coefficients h to be used by the digital predistorter 401 in distorting the input signal.

Thus, the system illustrated with respect to FIG. 4 applies a single set of digital predistortion coefficients for an array of signal branches. The coefficients are selected such that the individual power amplifier outputs result in a linear combination of nonlinear power amplifier outputs when combined over the air. For example, the modelling and/or measuring of the combination of nonlinearities in the beamforming direction may be performed by utilising an array factor (e.g. a factor by which the directivity function of an individual antenna can be multiplied to get the directivity of the entire array), where the digital predistortion coefficients are based on the combined feedback output.

The phased-array transmitter may control a transmission power of the transmitter either during production, calibration and/or operation of the apparatus. One of the most common approaches is to use the variable gain amplifiers 406a, 406b . . . 406n for this purpose. A power control algorithm controls the variable gain amplifiers' 406a, 406b . . . 406n operation to produce needed predetermined transmission power. Thus, the power control algorithm may control individual gains of the variable gain amplifiers 406a, 406b . . . 406n to comply with a combined transmission power requirement. The power control algorithm may be combined with the digital predistortion algorithm to optimize digital predistortion performance.

The phased-array transmitter may also use the variable gain amplifiers to shape the beam, e.g. in order to create nulls and/or maxima to a desired direction or directions. The shaping may be desired, for example, in order to decrease interference in some direction or directions. Many beamforming techniques such as zero-forcing (ZF) or maximum ratio transmission (MRT) control the amplitude of each antenna branch/transmit path in addition to the phase of each branch. The gain control may also be used to design the signal formed by the array output to have a certain sidelobe level, i.e. to decrease the interference in all other directions compared with the main beam. Such techniques are referred as amplitude tapering methods. An example amplitude tapering method is Taylor amplitude tapering.

The overall output from the array (aka the array behavior) can be measured and/or modelled by sampling the power amplifier outputs one by one and combining their responses. The measuring and/or modelling of the behavior may be done by utilizing a feedback structure such as the one depicted in FIG. 4, which "mimics" the array behavior of the power amplifier outputs in RF domain.

The input powers of individual power amplifiers 407a, 407b . . . 407n may be varied to control of the variable gain amplifiers 406a, 406b . . . 406n such that the power amplifiers 407a, 407b . . . 407n are operating in different linearity modes. Thus, the introduced predistortion from the predistortion coefficients may cause expansion for some of the power amplifiers 407a, 407b . . . 407n, which can compensate the compression of others of the power amplifiers 407a, 407b . . . 407n when the compressive-expansive behavior is combined over the air. The combining can be emulated by the set of controllable phase shifters 410a, 410b . . . 410n and the controllable attenuators in the feedback branch(s). Thus, the phase shifters 410a, 410b . . . 410n and the controllable attenuators 411a, 411b . . . 411n in the feedback branch emulate the radio channel, while those signals combined over the air are finally received at the receiver.

Figure 5B:
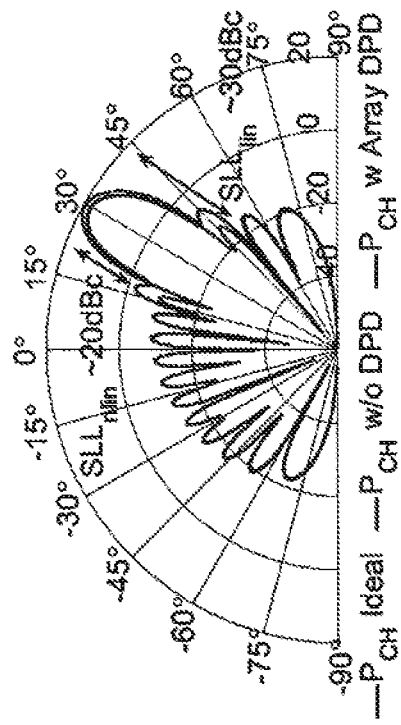
FIG. 5B shows an example of simulated beam shapes of the channel power over the azimuth half plane when linear and nonlinear power amplifiers are used and when common linearizer is and is not applied for linearizing a plurality of power amplifiers.
Figure 5C:
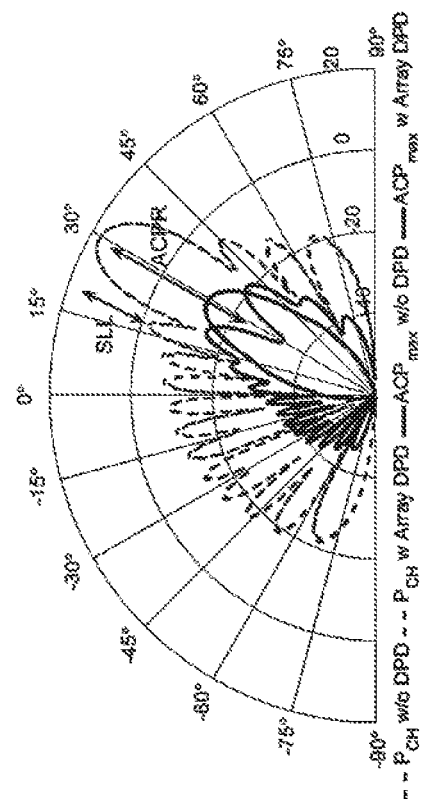
FIG. 5C shows an example of simulated beam shapes of the channel power and adjacent channel power over the azimuth half plane when nonlinear power amplifiers are used and when common linearizer is and is not applied for linearizing a plurality of power amplifiers.
Figure 5A:
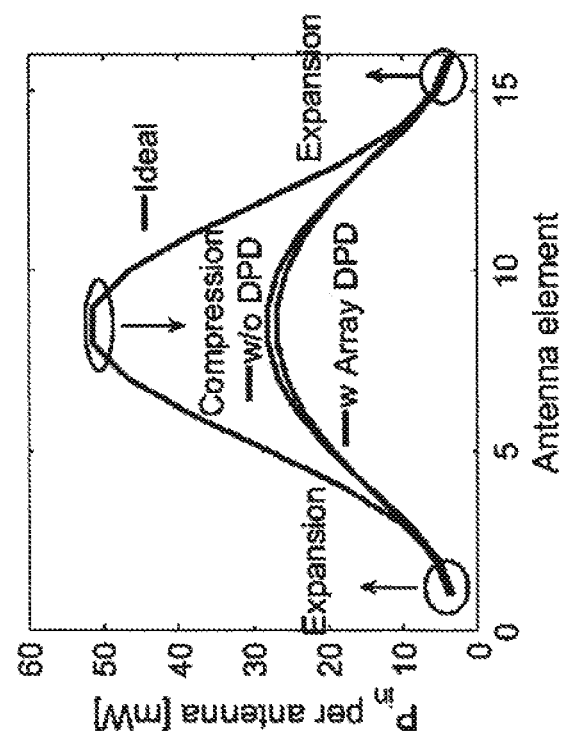
FIG. 5A shows an simulated example of a tapered power distribution over antenna inputs when linear and nonlinear power amplifiers are used and when a common linearizer is applied for linearizing a plurality of power amplifiers.

FIG. 5A shows an amplitude distribution over power amplifier outputs with Taylor tapering (target side lobe level is set to 30 dBc). The "ideal" amplitude distribution with "ideal" linear power amplifiers is shown at the top curve. The middle curve represents the amplitude distribution with nonlinear power amplifiers and without digital predistortion whilst the bottom curve represents the amplitude distribution with nonlinear power amplifiers and with array digital predistortion. Compared to the "ideal" distribution, the curve with the digital predistortion applied is compressed more towards the peak than the curve without digital predistortion. However, towards the tails, the curve with the digital predistortion applied has expanded more than both the "ideal" curve and the curve without digital predistortion.

Output powers from centrally located antennas are compressed when nonlinear power amplifiers are used without array digital predistortion. This is shown through the difference between the middle curve and the top curve. Output powers from the outermost antennas remain the same both with and without nonlinear power amplifiers. In contrast, when predistortion techniques are applied (bottom curve), the output powers from the central antennas are compressed more compared to the case without predistortion techniques being applied (middle curve) and output powers from the outer edge antenna are expanded because of the digital predistortion. Hence, any nonlinear regions are compressed more for the higher driven power amplifiers than for the lower driven power amplifiers. Moreover, digital predistortion expands the outermost power amplifiers and central power amplifiers by different amounts, which means that the digital predistortion has also changed the power distribution over the antennas. This results in changes in the beam shape compared with the case without linearization, as shown in FIG. 5B.

FIG. 5B shows beam patterns of antenna array in three difference scenarios: (1) "Ideal" pattern with linear power amplifiers are used, (2) "w/o DPD" pattern when nonlinear power amplifiers without digital predistortion are used, and (3) "w Array DPD" when nonlinear power amplifiers with digital predistortion are used. The plots for the arrays with digital predistortion show a compressed main lobe/beam and larger sidelobes immediately adjacent to the main beam. FIG. 5B shows that digital predistortion cannot recover the beam shape as the present digital predistortion technique is common for the array of parallel nonlinear power amplifiers. FIGS. 5A and 5B together illustrate that beam shape and digital predistortion have a relation to each other.

FIG. 5C shows beam patterns of a channel power measured over the main channel of a communication signal and adjacent channel power measured over adjacent channels of a communication signal output by an array of nonlinear power amplifiers. The solid plot having a main lobe coincident with the 30° direction presents the maximum of lower and upper adjacent channel power (ACP) without digital predistortion, and the solid plot having a minima along the 30° direction gives the respective curve for the case in which digital predistortion is applied. The dashed lines presents the beam pattern of the channel power in the same manner as those depicted in FIG. 5B. The ACP beam with digital predistortion makes a notch in the beamforming direction because a common digital predistortion is calculated in that direction. In other directions, the ACP is slightly increased compared with the case without digital predistortion. Similar to this, signal quality is maximized in the beamforming direction by the digital predistortion. Thus FIG. 5C shows that when a common linearizer is applied for a plurality of nonlinear power amplifiers, the nonlinear part and linear part of the signal may have a beam shape different from each other.

As shown by example in FIG. 5C, utilising the array linearization as per the system described with respect to FIG. 4 results in over-the-air linearization in which the beam shape of the nonlinear part of the signal may differ from the beam shape of the linear part of the signal. However, as shown in FIGS. 5A and 5B, the array predistortion changes the beam shape. In particular, if the amplitudes, bias points of the power amplifiers, operational voltages of the power amplifiers and/or mutual couplings between individual elements are varied, the beam shape will also vary with the input amplitudes and phases, leading to the beam pattern becoming signal envelope-dependent. Envelope-dependent beam means that each time or frequency domain waveform sample measured over the spatial domain in different directions may draw different beam shape due to the nonlinearity. However, amplitude differences between power amplifiers are used to shape the beam of the linear and nonlinear parts, and so introducing additional differences between the power amplifiers for linearization purposes will result in errors in the radiated beam shape, despite the differences enabling better linearization results (as shown in the example described with respect to FIG. 5C).

It is also useful to employ a calibration scheme to determine the power amplifier operation points accurately in order to both maximise efficiency of the power amplifiers and to stabilize the digital predistortion algorithm used. However, if power amplifiers have differences in their operation points, the beam calibration will affect the linearization, and vice-versa. In other words, changing power amplifier responses in either a linear or a non-linear way can change the overall linearity of the system over the air in a certain direction or a set of directions in which the array is intended to be linearized. In particular, the linearization may make individual amplifiers expand or compress their output signal (depending on their nonlinear characteristics), which will also change the beam shape. In other words, there is a symbiotic relationship between linearization and calibration operations. Therefore, to obtain both an intended beam shape and linearity (efficiency) simultaneously, the following proposes techniques for combining linearization and calibration operations.

Figure 6:
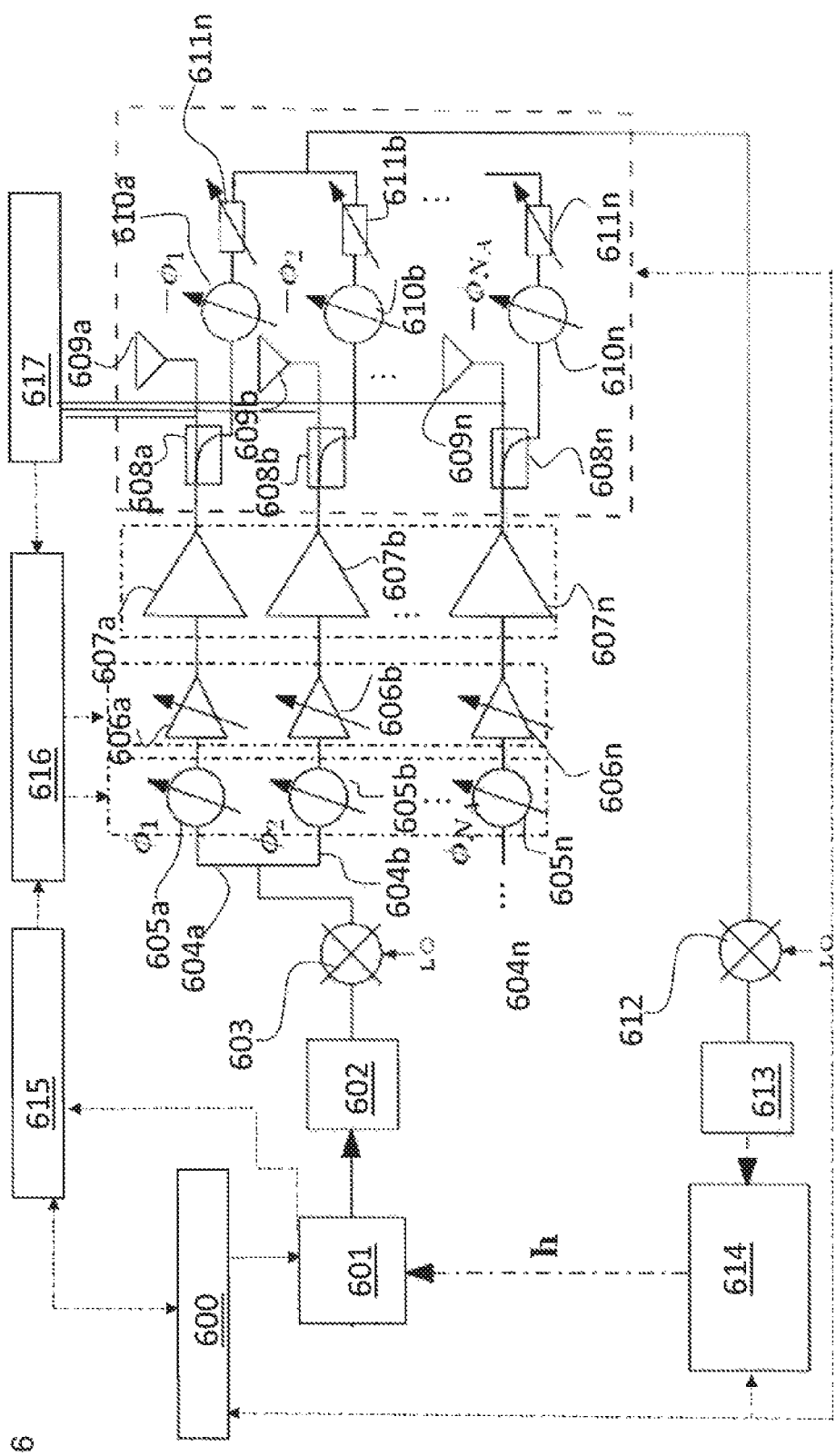
FIG. 6 shows a block diagram of an example system where beam calibration and common linearization processes are connected to each other.

FIG. 6 illustrates a potential system in which this technique may be employed.

FIG. 6 illustrates an input waveform being input from a processing unit 600 into a digital predistorter 601, which is coming from processing unit 620. The digital predistorter 601 distorts the input signal based on predistortion coefficients h (discussed later), which may be determining applying least squares fitting to solve the predistortion coefficients. The mathematical model may be, for example, a polynomial, memory polynomial or an envelope polynomial. The predistortion coefficients are coefficients of the mathematical model, which tries to model non-linear behaviour of the radio system. Other approaches for calculating predistortion coefficients h can be applied as well. In adaptive array DPD, the coefficients may be solved also by adaptive filtering methods such as least mean squares (LMS), recursive least squares (RLS), Kalman-filtering, etc. The digital predistorter 601 outputs the distorted waveform to a digital to analogue converter 602, which converts the signal into analogue form to a local oscillator 603. The local oscillator 603 upconverts the signal to a higher frequency and outputs the upconverted signal to a plurality of signal branches 604a, 604b . . . 604n. Each signal branch is non-linear and comprises respective phase shifters 605a, 605b . . . 605n (which apply respective phase shifts), variable gain amplifiers 606a, 606b . . . 606n, power amplifiers 607a, 607b . . . 607n, coupling elements 608a, 608b . . . 608n, which provides a copy of the signal in a branch to a respective antenna 609a, 609b . . . 609n and to feedback circuitry comprising a phase shifter 610a, 610b . . . 610n (which apply an inverse phase shift to that applied by phase shifters 605a, 605b . . . 605n) and a controllable attenuator 611a, 611b . . . 611n. The sum of the output from all of these branches is output to a local oscillator 612, which downconverts the summed signal to a lower frequency. The downconverted signal is then output to an analogue to digital converter 613, which converts the downconverted signal into digital representation by sampling at a sampling frequency. The digital representation/digital domain samples of the signal are input to a digital predistortion calculator 614, which determines the predistortion coefficients h to be used by the digital predistorter 601 in distorting the input signal.

Thus, the system illustrated with respect to FIG. 6, like that of FIG. 4, applies a single set of digital predistortion coefficients for an array of signal branches. The coefficients are selected such that the individual power amplifier outputs result in a linear combination of nonlinear power amplifier outputs when combined over the air. For example, the modelling and/or measuring of the combination of nonlinearities in the beamforming direction may be performed by utilising an array factor (e.g. a factor by which the directivity function of an individual antenna can be multiplied to get the directivity of the entire array), where the digital predistortion coefficients are based on the combined feedback output. This feedback output may be as described in relation to FIG. 4.

In addition to those components also displayed in FIG. 4, FIG. 6 also comprises a beam calibration mechanism. This is represented in FIG. 6 by target beamformer 615, a beam calibration unit 616 and a measurement unit 617 (represented by a single box taking input from the output of each of coupling elements 608a, 608b . . . 608n). For example, if the power of each amplifier is used for calibration, the measurement unit may include power detectors for measuring the respective output power of each power amplifier input. Alternative measurement mechanisms may be used for performing calibration, such as described below.

In operation, the target beamformer 615 provides information on an intended beam shape to the calibration unit 616. The measurement unit 617 provides feedback information to the calibration unit 616 on the signal being passed for transmission by the antennas. This feedback information may be on at least one of the following factors: the powers output by the power amplifiers, the voltages applied across each power amplifier, the signal envelopes of each individual branch, and the average envelopes of the individual branches. The feedback information may provide relate to a distribution over at least one antenna (or may relate to a distribution over a plurality of antennas in an antenna array). This feedback information thus essentially indicates the current output beam shape. The calibration unit may use this feedback information, in addition to the provided intended beam shape, to produce calibration coefficients for controlling each of the variable gain amplifiers 606a, 606b . . . 606n and/or phase shifters 607a, 607b, . . . , 607n.

Figure 7:
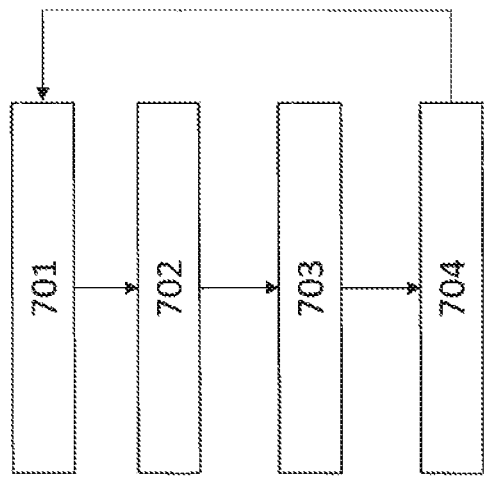
FIG. 7 shows a flow chart of the combined calibration and linearization process.

A flow chart detailing a potential operation of a system such as that illustrated with respect to FIG. 6 is provided in FIG. 7. FIG. 7 relates to a combined calibration and linearization process in which the power amplifier characteristics are pre-varied to increase the variability of nonlinearities of the nonlinear transmit paths and in which the power amplifier characteristics are also calibrated to form a desired (target) beam shape.

At 701, first beam shape coefficients for obtaining a first beam shape output for a linear part of a beam formed by an array of transmitters are applied by the array of transmitters. The first beam shape may be saved in a memory unit. This memory unit may store the first beam shape in a variety of different ways. For example, the first beam shape may be saved as register values, target bias voltages, currents and/or target output voltages, powers, signal envelopes and/or average envelopes. The first beam shape may include intended gain/power/phase variations over transmitter branches. Each transmitter is associated with a respective transmit path comprising a respective power amplifier. The first beam shape may be formed from target beamformer values taken from a memory of a processing unit of the apparatus. Beam shaping, in general, means that the shape of the overall beam may be controlled by controlling the amplitudes and phases of individual paths by, for example, controlling the phases shifts, delays, power gains and/or bias currents of the individual branches. Thus changes to an amplitude balance over all of the antennae/power amplifiers can result in changes to the beam shape. After the first beam shape has passed through the power amplifier, the non-linear parts of the power amplifiers causes the amplitude and phase distribution of the output signal to differ from the amplitude and phase distribution of the input signal. The processing unit may alter the target beam shape during the operation of the apparatus based on at least one of: the differences in the nonlinearity between the nonlinear branches, the interference level surrounding the transmitting radio apparatus, received signal power levels, movement of the mobile devices, quality level of the received signal, the direction of interference, direction of transmission.

At 702, the characteristics of at least one transmit path are varied to increase nonlinear characteristics between the transmit paths. The variation is performed to provide a target beam shape for a non-linear part of the beam formed by the array of transmitters. In other words, the characteristics of the at least one transmit path are varied to increase the variability between non-linearity of transmit paths. As an example, the characteristics may be varied in a number of different ways. Examples of how this variation can be effected is via at least one of: altering the phase of a phase shifter in at least one transmit path, by altering the gain of a variable gain amplifier in at least one transmit path, and biasing of a power amplifier in at least one transmit path. The point of these operations is to give different signal paths different nonlinearities to each other in order that the distortion beam shape can be shaped differently to the linear part of the output beam shape.

At 703, a linearization is applied to linearize the output of the array of transmitters. In this sense, it is understood that linearization is a mathematical process of finding a linear approximation of inputs and corresponding outputs. This linearization may be performed by determining first linearization coefficients for the array for digitally predistorting the input signal to the array and applying the first linearization coefficients to the signal input to the array. For example, the power amplifier array response may be measured using a feedback receiver that mimics or otherwise emulates the radio channel in some specific spatial direction. The predistortion may be performed for the waveform (which comprises time domain samples). Information from this feedback receiver may then be used to provide linearization coefficients for the array (digital predistortion). In principle, as discussed above, the linearization output has an expansive shape, which means that some power amplifiers are expanding their input signal for output whilst others are contracting their input signal for output. This means that the beam of the distortion is also being shaped by the linearization, which affects each individual branch differently depending on their characteristics. This, in turn, changes both the nonlinear and linear parts of the beam. To correct this, the calibration coefficients may be re-calculated with the initial calibration coefficients in 701.

At 704, a calibration is applied to calibrate the powers of the power amplifiers outputs of the transmitter array. In this sense, it is understood that calibration is an electrical and/or a mathematical process for configuring an instrument to provide an output for an input within an acceptable range. This calibration may be performed by measuring error distributions over at least two transmit paths, modifying the first beam shape coefficients to better obtain the first beam shape subsequent to the linearization, and applying the modified first beam shape coefficients to the array of transmitters. In this sense, the term "better" is used to indicate that the signal output by the transmitter array more closely resembles the target beam shape by applying the modified first beam shape coefficients than if the first beam shape coefficients were unmodified. The amplitude or power distribution over the antennas may be measured using the powers of or envelope functions of the individual branches. As mentioned above, either of these distributions may be used to determine the actual output beam shape, which affects both the linear and non-linear parts of the beam. The calibration scheme may be performed over the antennas (power, amplitude or envelope distribution). The point of the calibration process is to control the shape of the linear part of the beam while 702 and 703 controls the shape of the nonlinear part of the beam.

The process may alternate between the calibrating/beam shaping process and the common linearization operational modes until a desire beam shape of linear and non-linear components is achieved. It is useful to provide several iterations if linear correction is used as the array is nonlinear.

Thus, as described above, the presented phased array system has both a common lineariser and calibration and, in contrast to the previously described system, there is provided a beam calibration part that is used to calibrate the nonlinear beam shape. The beam calibration may tune/calibrate signal paths individually. This is in contrast to the common linearization scheme in which a common set of predistortion coefficients are used to shape the signal input to the array.

Figure 8:
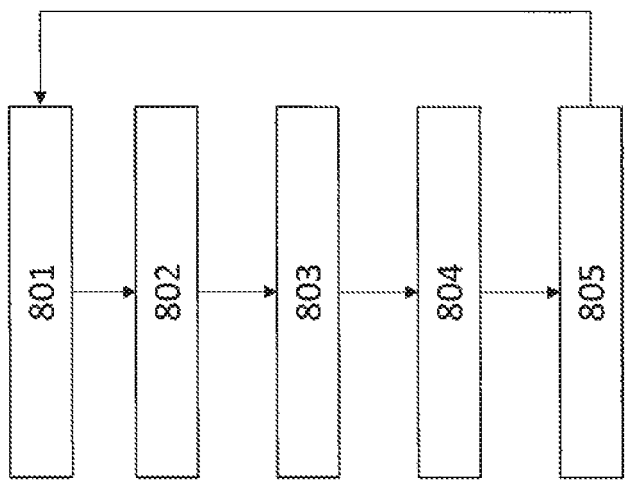
FIG. 8 shows a flow chart of the combined calibration and linearization process in which the calibration and linearization processes are combined.

FIG. 8 provides an algorithm description for beam calibration being performed with linearization techniques.

The steps of FIG. 8 may be applied while a determined beam error is larger than a threshold value. The threshold value may alter/be varied during the operation of the apparatus performing the steps of FIG. 8.

At 801, an output beam is determined by measuring the power distribution of power amplifier outputs. It is understood that this is only one mechanism for determining the output beamform and that other mechanisms, such as those discussed herein may also or alternatively be used to determine the output beam in 801.

At 802, beam correction coefficients are solved over all amplitudes between the target beamformer values and the measured beamformer. The target beamformer values may be obtained from a memory unit, as per the above-described examples. The measured power distribution may be obtained from the measured power amplifier outputs in the present example.

At 803, the solved beam correction coefficients are applied to alter the outputs of the power amplifiers. The beam correction coefficients may cause a different correction factor to be applied to different power amplifiers. In other words, each signal path is individually/separately calibrated.

At 804, waveform digital predistortion is performed, as described above.

At 805, the new beam error from the combination of the applied waveform digital predistortion and the applied beam correction coefficients is calculated. The process then repeats until the calculated beam error is less than the threshold value.

Figure 9B:
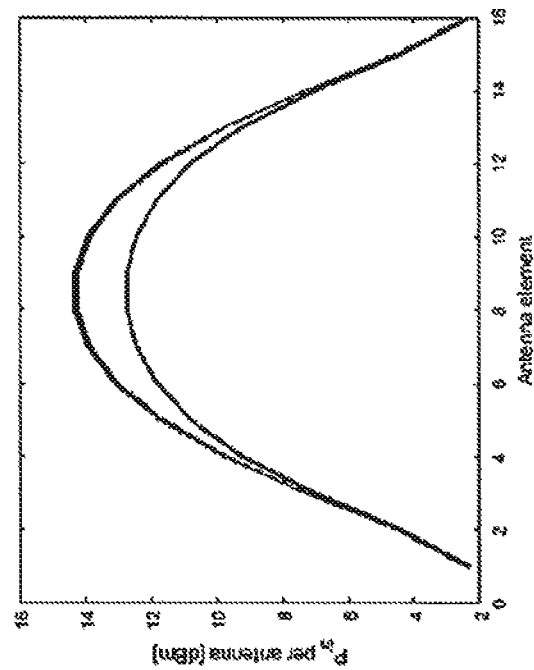
FIG. 9B shows an example of the power distributions over antennas when process described in FIG. 8, with and without step 804 of FIG. 8, is and is not used.
Figure 9A:
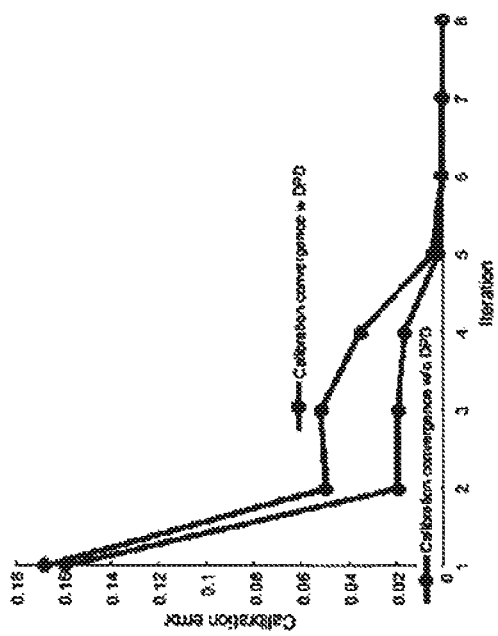
FIG. 9A shows an example of convergence of the process described in FIG. 8 with and without step 804 of FIG. 8.

FIGS. 9A and 9B show effects of the applied calibration.

FIG. 9A illustrates how the calibration error decreases as the number of iterations of this mechanism discussed in FIG. 8 increases. The bottom plot on this graph shows calibration convergence without digital predistortion while the upper plot shows calibration convergence with digital predistortion.

FIG. 9B shows how the target beam shape alters in dependence on the process applied. In particular, the bottom curve (red) shows how the target beam is compressed when neither calibration nor digital predistortion is applied. In contrast the beam formed when beam calibration or beam calibration and array digital predistortion is used is substantially similar to the ideal line, and overlap each other. Hence, the mechanism discussed in FIG. 8 calibrates the output power distribution over the array when digital predistortion is also applied.

The algorithm described with respect to FIG. 8 may occasionally develop stability issues if the array is very nonlinear. This is because calibration changes the operation point in which the digital predistortion is operating and digital predistortion changes the operation point in which the calibration is operating. In order to address this, an alternative version of the algorithm may be used. This is described below in relation to FIGS. 10 and 11.

In FIG. 10, while the beam error is larger than a threshold value, the system applies steps 1201 to 1203.

At 1201, the output beam is measured (e.g. using the power distribution of the power amplifiers).

At 1202, beam correction coefficients are determined over amplitudes between the target beamformer and the measured beamformer.

At 1203, the beam correction coefficients are applied to the transmission paths and a new beam error is calculated. The process then starts again from 1201 until the calculated beam error is smaller than the threshold value. When the calculated beam error is smaller than the threshold value, steps 1204 and 1205 are applied. The actual threshold values used may be determined with respect to the actual system them are being applied in and any threshold values may be varied during the operation.

At 1204, array predistortion is performed.

At 1205, the beam error from the digital predistortion is determined. If this determined beam error is less than the threshold value, the process goes back to steps 1202 in order to calculate new calibration coefficients for input signal being predistorted by the coefficients derived in step 1204. The threshold value used in step 1205 may be different from the threshold value used in the step 1201 in order to improve the algorithm convergence.

Thus, FIG. 10 relates to a system in which calibration is performed first until a beam error below a certain value is obtained, before linearization is performed. Linearization is then applied and the process is continued until the beam error from linearization is smaller than a threshold value. The system may switch between the two operations (linearization and calibration) if the determined beam errors cause them to (i.e. if the comparison of the measured error to the respective threshold causes this switch to happen).

Figure 11B:
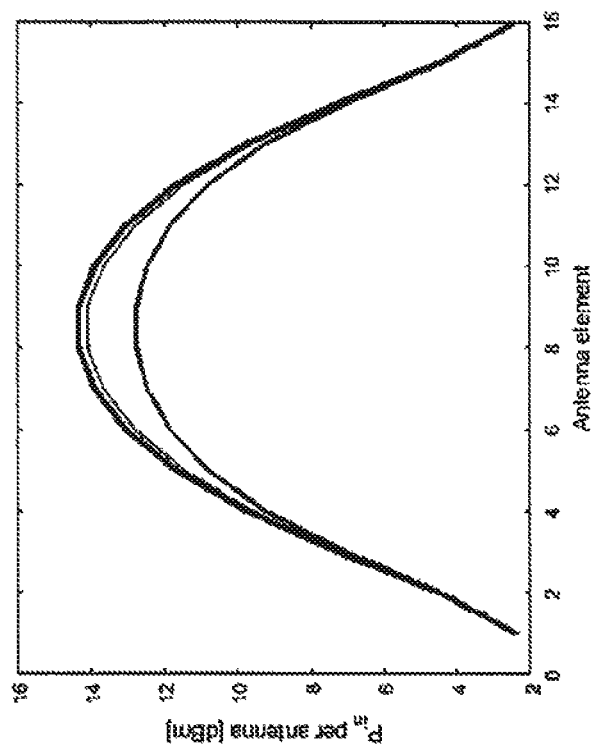
FIG. 11B shows an example of power distributions over antennas when the process described in FIG. 10, both with and without step 1204 of FIG. 10, is applied.
Figure 11A:
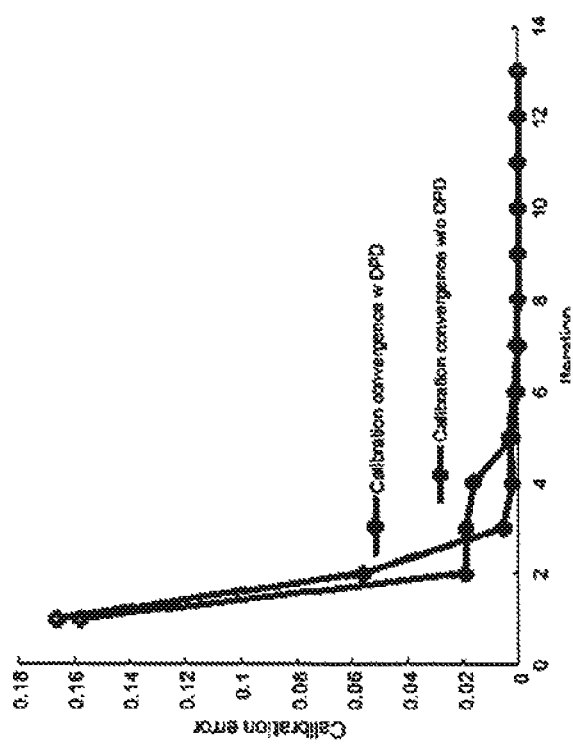
FIG. 11A shows example convergences of the process described in FIG. 10, both with and without step 1204 of FIG. 10 being performed.

FIGS. 11A and 11B illustrate the effect of calibration.

FIG. 11A illustrates how the calibration error decreases as the number of iterations of this mechanism increases. The calibration convergence without digital predistortion doesn't initially drop to as low a calibration error as the calibration convergence with digital predistortion plot, but exhibits an intermediate zone in which calibration convergence lower than that of the calibration convergence with digital predistortion plot.

FIG. 11B shows how the target distribution of the antenna inputs changes in dependence on the process applied. In particular, the bottom curve shows that the target distribution is compressed when neither calibration nor digital predistortion is applied. In contrast the beam formed when beam calibration is used is substantially similar to the ideal line, whilst the curve for beam calibration and array digital predistortion is slightly below the ideal line. The reason for differences between the curves with and without digital predistortion and the ideal line is the used threshold values in simulations. The curves can converge to each other with appropriate threshold value selection. The actual shape of the curve is dependent on the threshold values applied, and so a system designer may tailor this to the actual equipment being used in a particular environment. Any changes in the amplitude distribution over the antenna elements results in changes in the intended beam shape.

Figure 12:
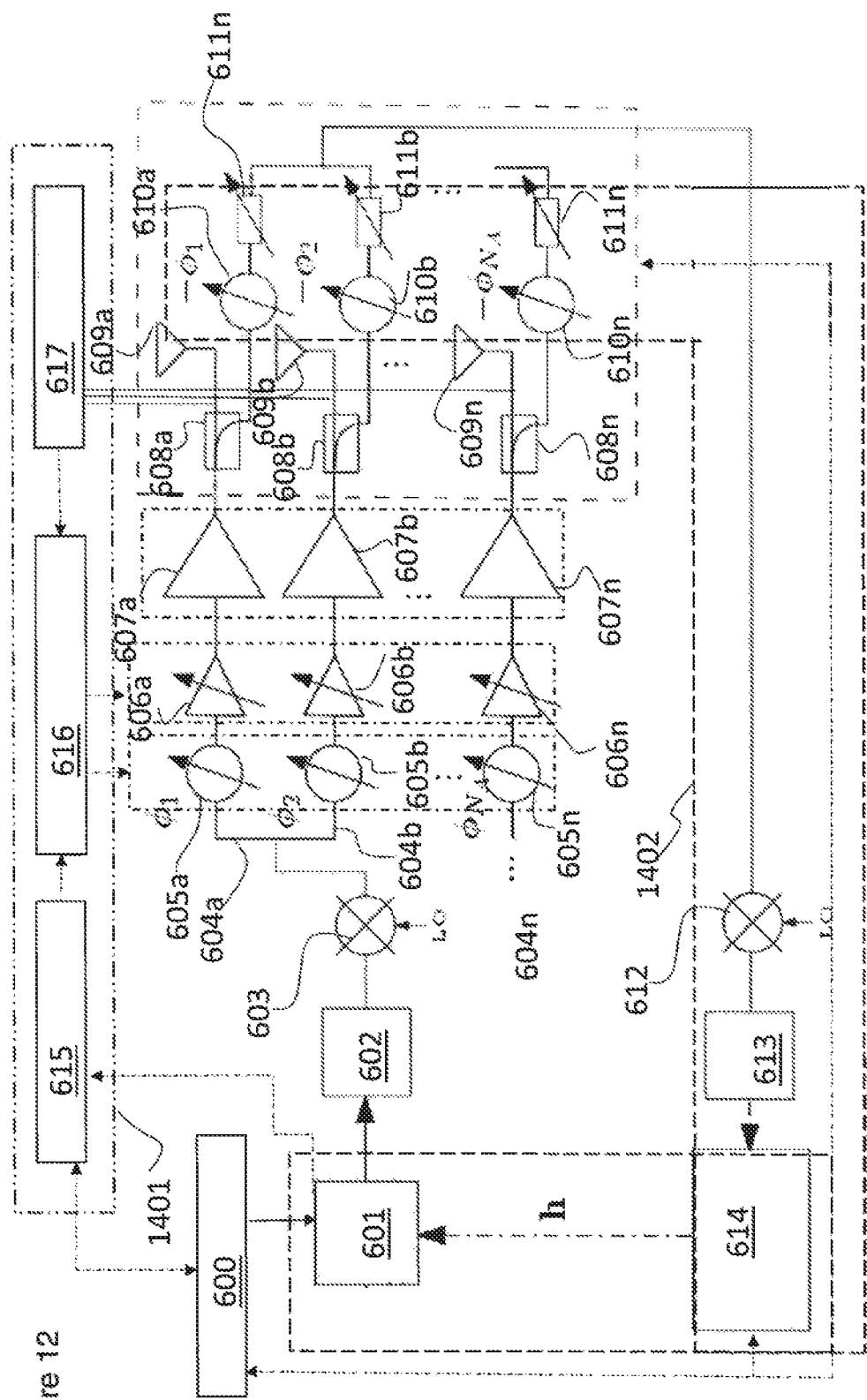
FIG. 12 shows a block diagram of an example system where beam calibration and common linearization processes are separated from each other.

FIG. 12 shows an example block diagram in which the array calibration process and linearization are further separated from each other. This may be performed, for example, if the calibration process is significantly faster than the digital predistortion process. The flows of the processes are similar to those shown in FIG. 10, but differs in that information is not shared between the calibration and linearization processes. In such a case, the array calibration may be automatic in that the digital predistortion process automatically takes into account the changes in the calibration coefficients. This may be effected by two loops running in parallel, as described further below. Elements are shown having the same numbering as those used in FIG. 6.

In the first loop 1401, array calibration is performed and comprises target beamformer 615, a calibration unit 616 and measurement unit 617 (represented by a single box taking input from the output of each of coupling elements 608a, 608b . . . 608n). The first loop may perform calibration in three steps. In the first step, the actual beam shape is determined (e.g. using the power distribution output by the power amplifiers or some other measurement, such as described above). In the second step, beam coefficients are determined by comparing differences between the target beamformer and the measured beamformer. In the third step, the amplitudes of the power amplifiers are varied using the variable gain amplifiers to attempt to remove the compared differences.

In the second loop 1402, linearization (such as digital predistortion) is performed. The second loop 1402 may comprise phase shifters 610a, 610b . . . 610n, controllable attenuators 611a, 611b . . . 611n, local oscillator 612, analogue to digital converter 613, digital predistortion calculator 614 and digital predistorter 601. The second step may be performed in two steps. In the first step, the combined nonlinearity of the output wave is measured. In a second step, digital predistortion is performed to predistort the array input waveform (as described above in connection with FIG. 4).

Figure 13:
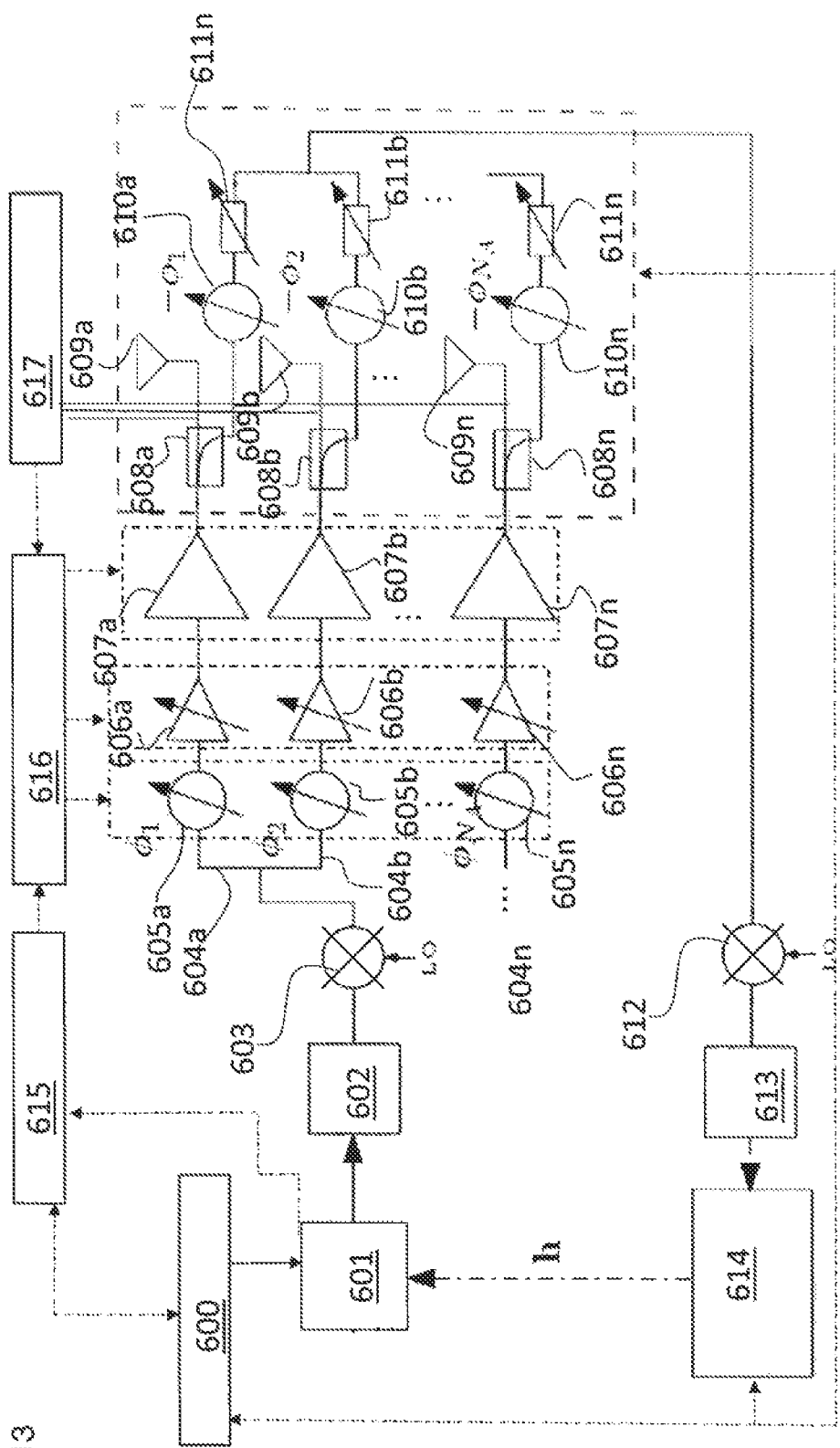
FIG. 13 shows a block diagram of an example system where beam calibration and common linearization processes are connected to each other and power amplifier characteristics are controlled during beam calibration and common linearization processes.

FIG. 13 shows an example of an arrangement in which the beam calibration unit may also control at least one of the bias voltages, currents, gains, or operation points of individual power amplifiers. The power amplifier characteristics may be controlled in order to increase the efficiency of individual branches and/or increasing the variability of nonlinear branches in order to produce variations that can be further used to cancel each other over the air by the digital predistortion. FIG. 13 uses the same reference numerals as FIG. 6 to indicate similar elements.

Figure 14A:
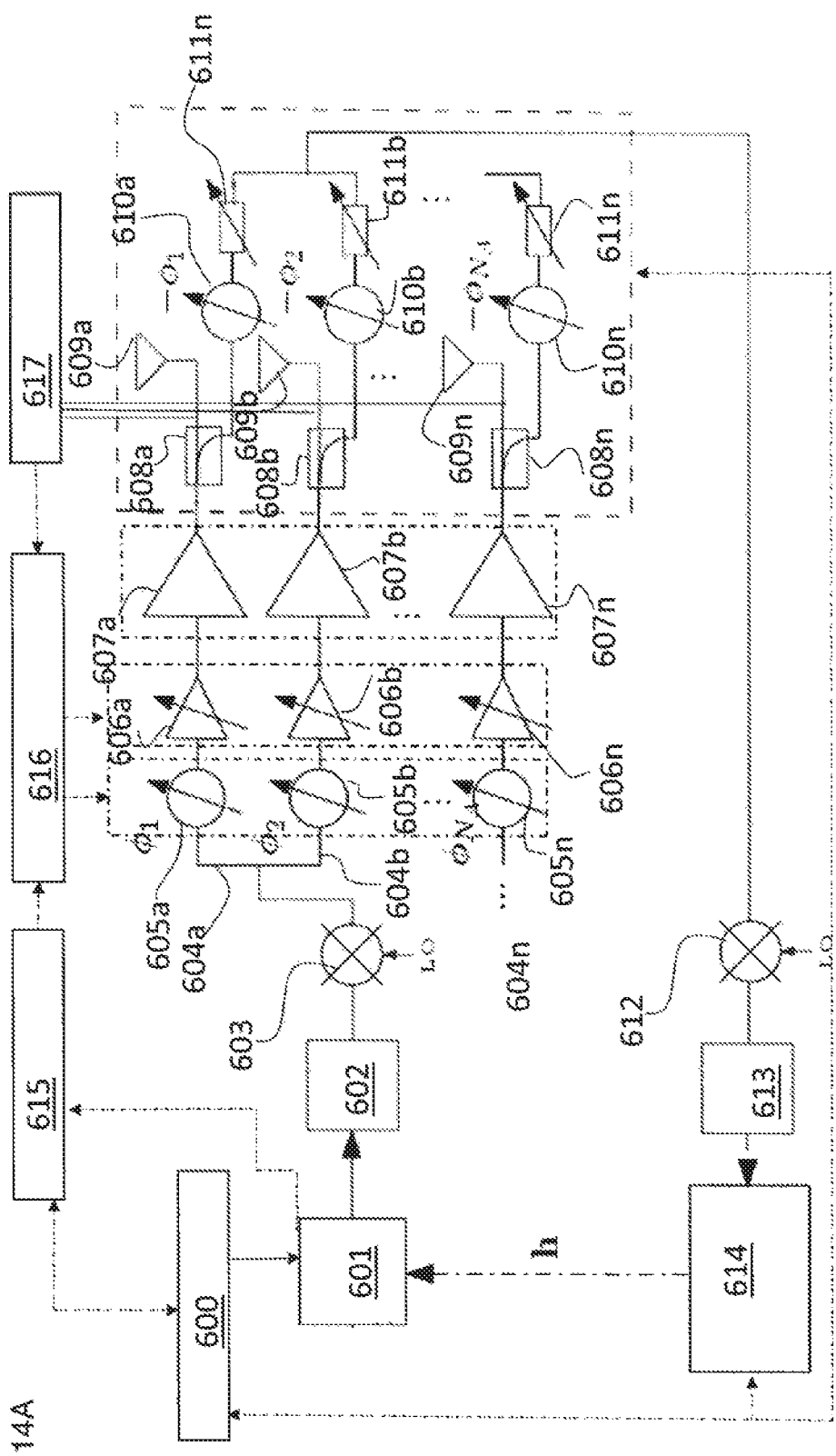
FIG. 14A shows a block diagram of an example system where beam calibration is performed for signal envelopes or average envelopes and combined with a linearization process.

FIG. 14A shows another example of how beam calibration and linearization may be combined. FIG. 14a uses the same reference numerals as FIG. 6 to indicate similar elements.

In this example, the calibration unit is arranged to follow the output envelopes of each power amplifier or the average envelopes of each power amplifier and to change the operational voltages of individual power amplifiers to cause the power amplifiers to operate in a more efficient mode. Alternatively or in addition, the bias points of the power amplifiers may be changed based on the measured envelopes. As the tracking may be performed as a function of an envelope (i.e. on the function of an average amplitude of a waveform), then the beam calibration also corrects the beam pattern of the envelope.

Figure 14C:
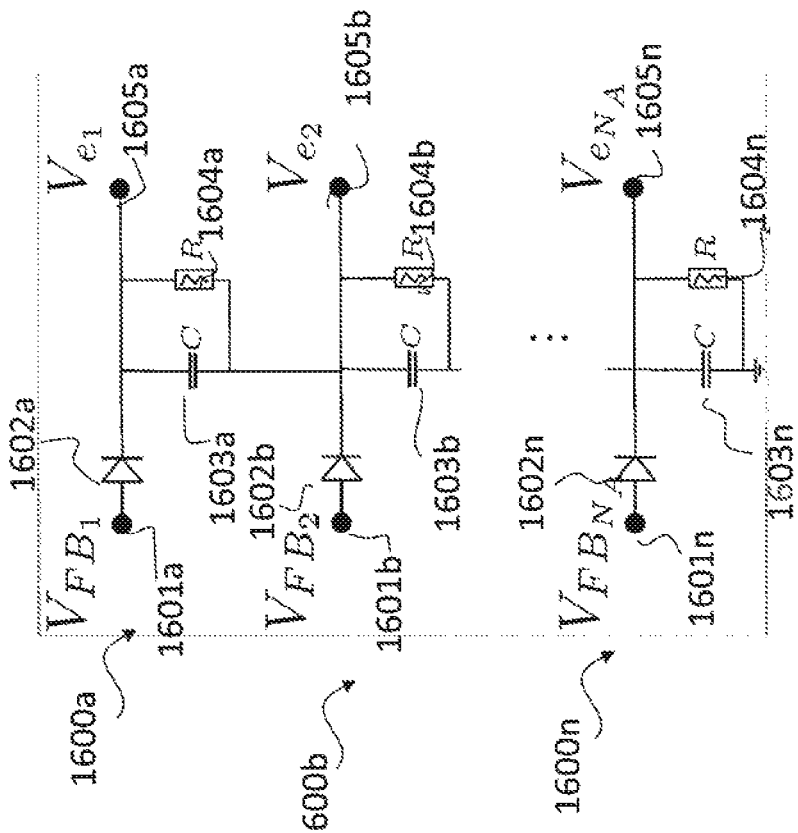
FIG. 14C shows a schematic drawing of an example circuitry for determining an envelope difference distribution over the antennas.
Figure 14B:
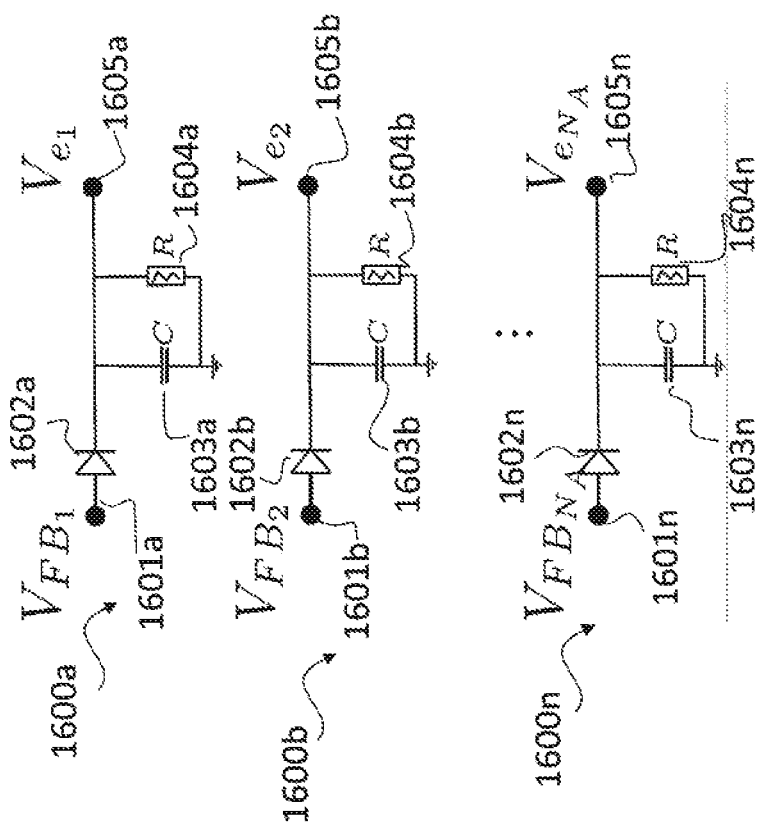
FIG. 14B shows a schematic drawing of an example circuitry for determining an envelope distribution over the antennas.

Example implementation of measurement circuitry blocks for measuring the signal envelope distribution over the antenna inputs in FIG. 14A are illustrated with respect to FIGS. 14B and 14C.

In FIG. 14B, an arrangement for detecting the envelope or power distribution over an array of antennas is provided as follows. There is provided a plurality of transmit paths 1600a, 1600b, . . . 1600n, each transmit path providing a respective input 1601a, 1601b, . . . to a respective diode 1602a, 1602b, . . . 1602n. A respective series of capacitors 1603a, 1603b, . . . 1603n and a series of resistors 1604a, 1604b, . . . 1604n are connected in parallel to each diode. A respective output 1605a, 1605b, . . . 1605n represents a detected envelope. If the detectors are connected to each other, the envelope distribution can be detected from this output, e.g. from the nodes Vel VeNa of the detection circuit.

FIG. 14C provides another arrangement for detecting the envelope or power distribution over an array of antennas. FIG. 14C utilises the same labelling as FIG. 14B to denote similar element. This arrangement differs from that of FIG. 14B in that the envelope detection circuits are connected to each other. This circuitry thus gives an envelope distribution with respect to an adjacent antenna and hence the circuitry directly measures the envelope differences over the antenna branches. This arrangement can be alternatively connected to coupling elements placed after phase shifters in the feedback circuitry of FIG. 14A, such that the phases of the inputs to the envelope detectors VFB1 . . . VFBNa can be controlled.

Figure 15:
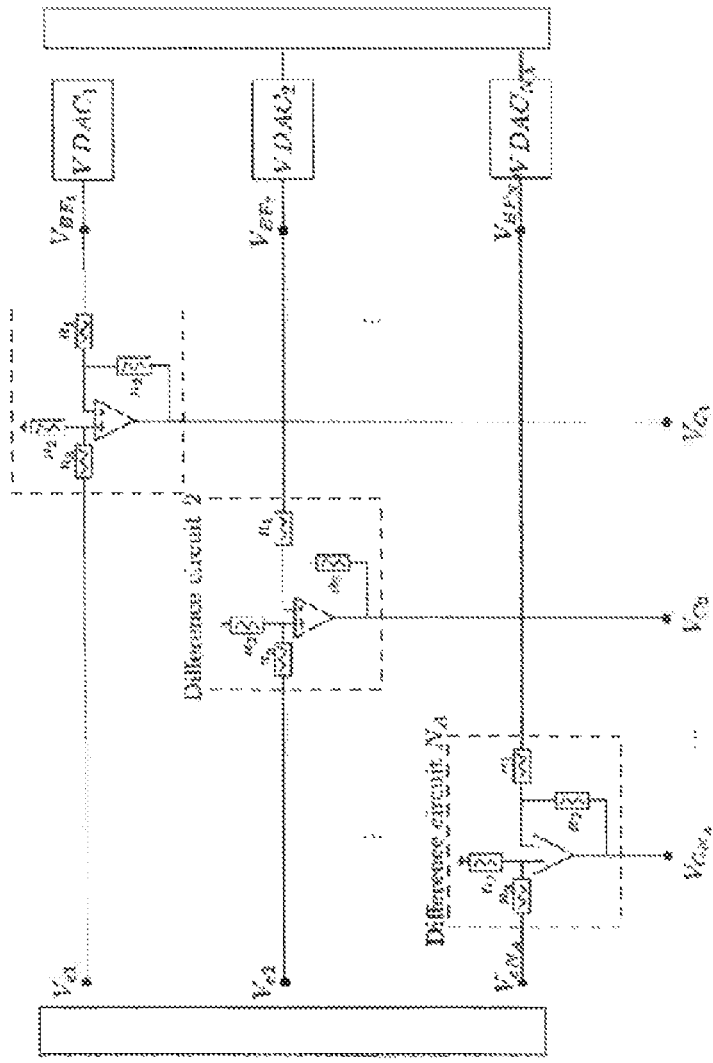
FIG. 15 shows a schematic drawing of an example difference circuitry for calculating calibration coefficients and/or error distributions over at least one antenna.

An example implementation of difference circuitry of calibration unit in FIG. 14A for producing the calibration weights based on the target beamformer and measured envelope or power distribution is shown in FIG. 15.

In FIG. 15, there is shown a plurality of "difference circuits", each difference circuit being associated with a respective power amplifier/signal path. For each difference circuit, a voltage representing a target beamformer signal is input, a voltage signal from the measurement unit (e.g. from power or envelope detectors) associated with the power amplifier/signal path of that difference circuit is input, and a new control/calibration voltage for the associated power amplifier is output. The difference circuits may comprise, for example, an operational amplifier and a plurality of resistors. One resistor R1 may lie between an input of the operational amplifier and the input of the target beamformer values. Another resistor, R2, may be connected between the output of R1 and the output of the difference circuit. R2 may further be set towards ground from other operational amplifiers. Another resistor, R3, may be connected between another input of the operational amplifier and the voltage from the measurement unit.

The target beamformer values are changed to analogue voltages by voltage digital to analogue converters (VDACs). Each measured envelope, average envelope or power is compared against the analogue target beamformer voltages of the respective branch by the difference circuit. If R3 is chosen to be very small and R1 is chosen to be same value as R2, the new calibration coeffcients can be directly read from the outputs of the differentiator circuits as $Vc_1 \ldots Vc_N$. Alternatively, if R3 is chosen to be same as R1 and R2, the circuitry gives the difference between the input voltages that can be further processed to produce the next calibration voltages for each amplifier branch.

Figure 16A:
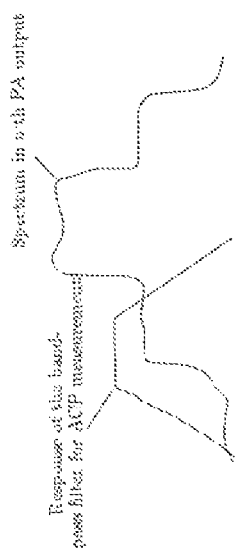
FIG. 16A shows an example of the distorted signal spectrum and frequency response of the adjacent channel power filter shown in FIG. 16B.
Figure 16B:
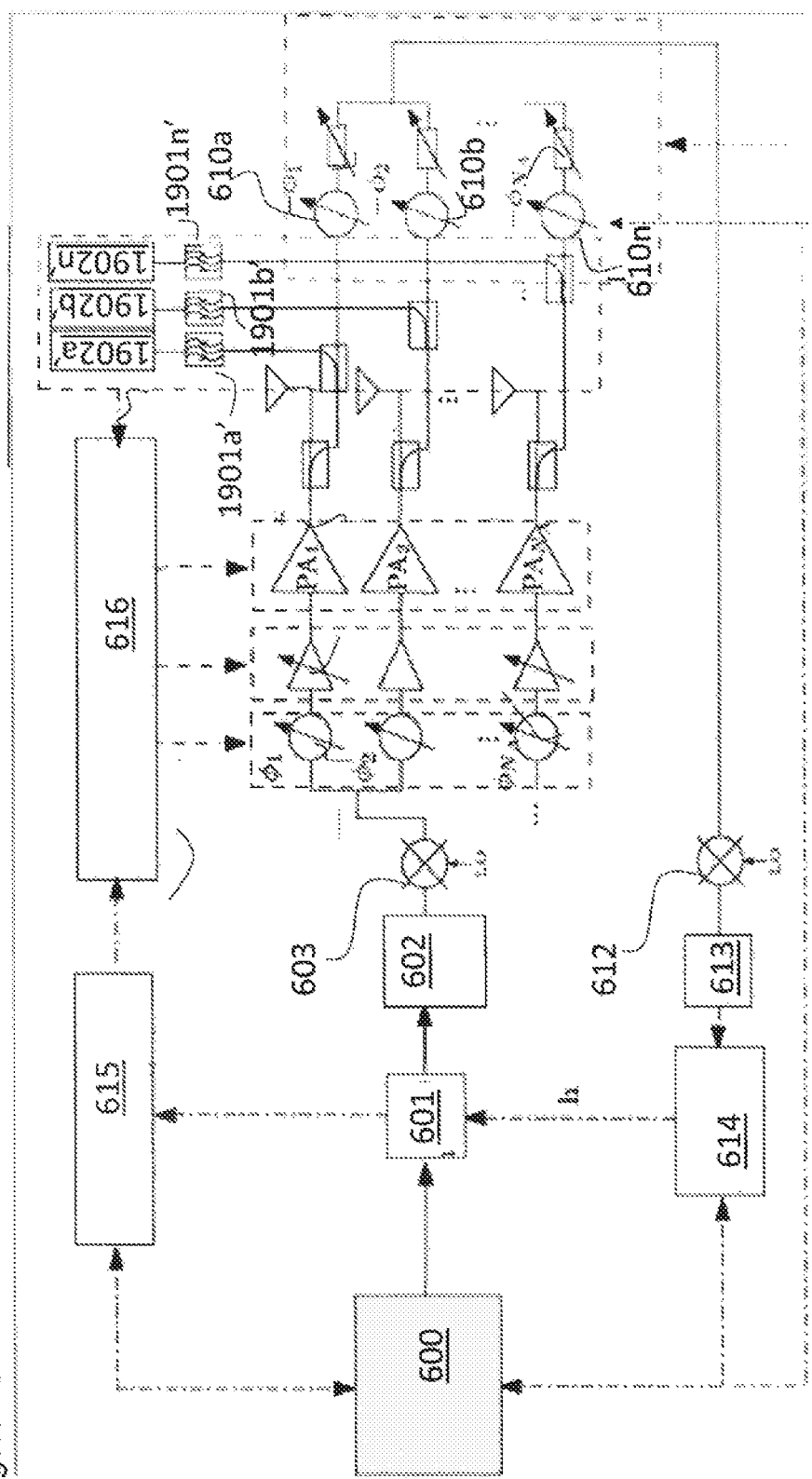
FIG. 16B shows a block diagram of an example system where beam calibration and linearization processes are combined such that the total radiated adjacent channel power performance is guaranteed.
Figure 16C:
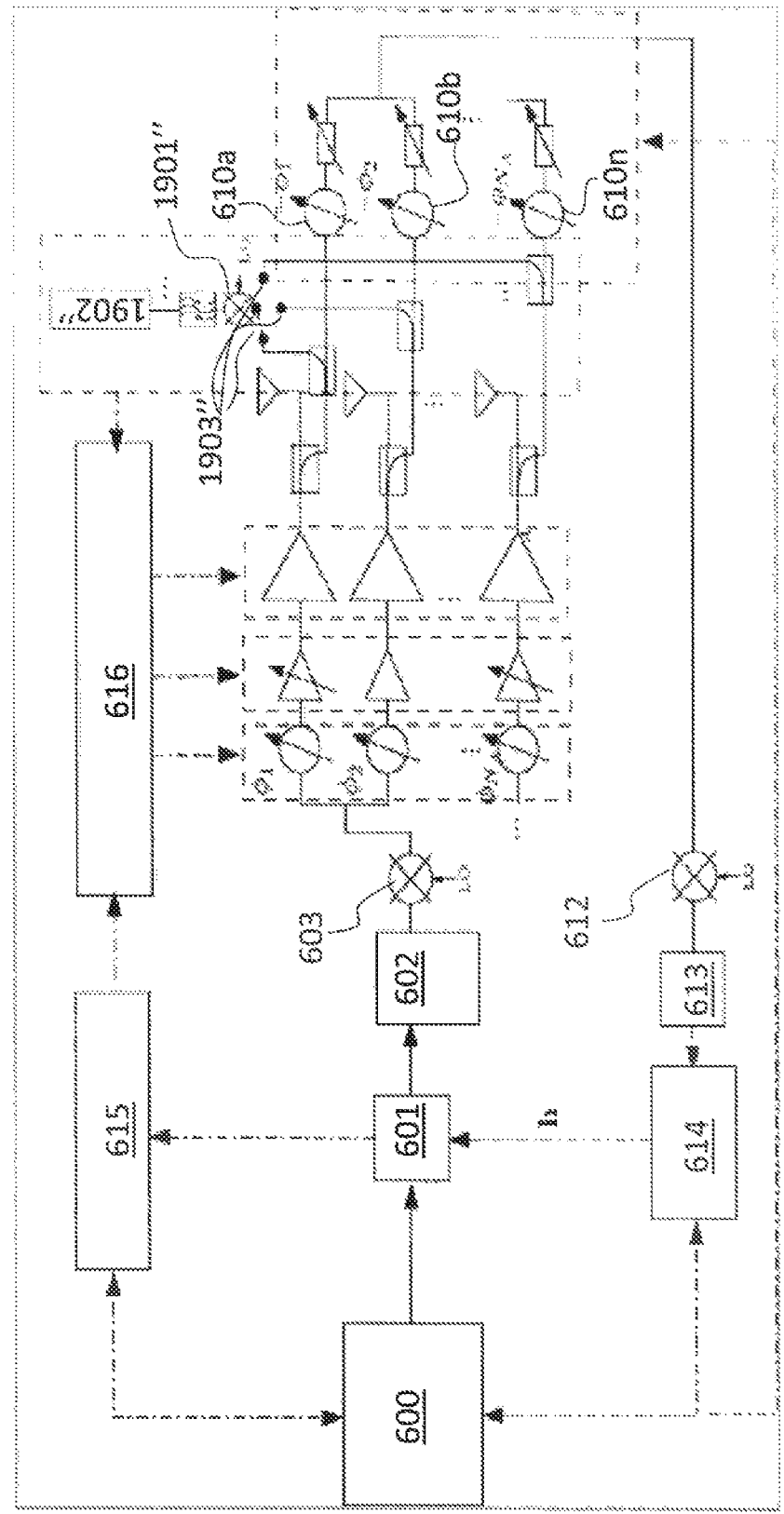
FIG. 16C shows another block diagram of an example system where the beam calibration and linearization processes are combined such that the total radiated ACP performance is guaranteed but only one shared adjacent channel power filter is used.

FIGS. 16A to 16C illustrate an example in which a combined calibration and digital predistortion scheme is used in order to achieve a total radiated adjacent channel power performance in accordance with an operating communication protocol (e.g. 3GPP/New Radio). Total radiated adjacent channel power (ACP) is a figure of merit in which the adjacent channel power is integrated over the space. Hence, directing the ACP (as illustrated with respect to FIG. 5C) does not necessarily change the total radiated ACP. This is because the antenna array fundamentally only directs the power and so measuring the ACP in one direction does not give an indication of the total radiated ACP because other directions may have different amounts of distortion.

FIG. 16A shows two plots superposed on each other. A first plot, 1901, represents a response of a bandpass filter for ACP measures. A second plot 1902 represents a spectrum in the output of an nth power amplifier in the transmitter array.

The total radiated adjacent channel power ratio (ACPR) can be calculated as a difference between the total radiated channel power (e.g. a sum over channel powers over power amplifier outputs) and total radiated adjacent channel power (a sum over adjacent channel powers of power amplifiers). In this arrangement, the calibration circuitry filters a portion of an adjacent channel power as shown in FIG. 16A, by RF filters of each power amplifier output and sums the filtered portions together during the processing. As the individual power amplifier outputs do not depend on a beamforming direction, the formed indication represents a total amount of radiated adjacent channel power over three-dimensional space. This may be used to control power amplifier responses (such as input amplitudes, bias voltages, etc.) to cause the responses to be different enough to each other that over-the-air linearization can benefit from the differences in their responses. This can help to improve quality of signal in the transmission direction in addition to helping to cause compliance with an adjacent channel power total radiated power requirement of an operating communication protocol. Therefore, the calibration circuitry may also be used to ensure compliance with the total radiated adjacent channel power linearization requirement of a transmission array, such as discussed above in connection with FIG. 4. This arrangement/method thus gives a possibility to make a trade-off between total radiated ACP integrated over the space and quality of signal measured at the intended transmission direction.

FIG. 16B is a block diagram of the combined calibration and linearization circuitry. This Figure differs from that of FIG. 6 in that example components of the measurement unit are illustrated.

In this example, each output from a transmit path is input to a respective bandpass filter $1901a'$, $1901b'$, ... $1901n'$, which in turn passes the output to a respective received signal strength indicator $1902a'$, $1902b'$, ... $1902n'$. The output from these received signal strength indicators are output to the calibration unit.

FIG. 16C presents a block diagram of another arrangement for making a total radiated ACP measurement.

This Figure differs from that of FIG. 6 in that the measurement unit comprises a downconverter 1901" configured to receive any one input from a plurality of outputs of a transmit path 1902". This selection between an output/transmit path may be effected by switching elements 1903". The signal output by the downconverter 1901" is output to a bandpass filter 1904", which in turn passes it to a received signal strength indicator 1905" (after filtering).

In FIG. 16C, the signal is downconverted by downconverter 1901" to a lower frequency before filtering in order to decrease the requirements of the filter that is filtering the portion of the ACP for total radiated ACP calculation block. The mixer or mixers in may be shared with multiple feedback branches by switching elements 1903" in order to decrease the complexity of the circuit.

It is understood in the above that circuitry for the beam calibration may receive information indicating the applied linearization coefficients directly from the digital predistortion calculation unit. The circuitry for the beam calibration may use this received information to determine how to calibrate at least one power amplifier in the array of power amplifiers. It is further understood that circuitry for the beam calibration may not receive information indicating the applied linearization coefficients directly from the digital predistortion calculation unit.

It should be understood that each block of the flowchart of the Figures and any combination thereof may be implemented by various means or their combinations, such as hardware, software, firmware, one or more processors and/or circuitry.

It is noted that whilst embodiments have been described in relation to one example of a standalone LTE networks, similar principles may be applied in relation to other examples of standalone 3G, LTE or 5G networks. It should be noted that other embodiments may be based on other cellular technology other than LTE or on variants of LTE. Therefore, although certain embodiments were described above by way of example with reference to certain example architectures for wireless networks, technologies and standards, embodiments may be applied to any other suitable forms of communication systems than those illustrated and described herein.

It is also noted herein that while the above describes example embodiments, there are several variations and modifications which may be made to the disclosed solution without departing from the scope of the present invention.

It should be understood that the apparatuses may comprise or be coupled to other units or modules etc., such as antennas, radio parts or radio heads, used in or for transmission and/or reception. Although the apparatuses have been described as one entity, different modules and memory may be implemented in one or more physical or logical entities.

In general, the various embodiments may be implemented in hardware or special purpose circuits, software, logic or any combination thereof. Some aspects of the invention may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

The embodiments of this invention may be implemented by computer software executable by a data processor of the mobile device, such as in the processor entity, or by hardware, or by a combination of software and hardware. Computer software or program, also called program product, including software routines, applets and/or macros, may be stored in any apparatus-readable data storage medium and they comprise program instructions to perform particular tasks. A computer program product may comprise one or more computer-executable components which, when the program is run, are configured to carry out embodiments. The one or more computer-executable components may be at least one software code or portions of it.

Further in this regard it should be noted that any blocks of the logic flow as in the Figures may represent program steps, or interconnected logic circuits, blocks and functions, or a combination of program steps and logic circuits, blocks and functions. The software may be stored on such physical media as memory chips, or memory blocks implemented within the processor, magnetic media such as hard disk or floppy disks, and optical media such as for example DVD and the data variants thereof, CD. The physical media is a non-transitory media.

The memory may be of any type suitable to the local technical environment and may be implemented using any suitable data storage technology, such as semiconductor based memory devices, magnetic memory devices and systems, optical memory devices and systems, fixed memory and removable memory. The data processors may be of any type suitable to the local technical environment, and may comprise one or more of general purpose computers, special purpose computers, microprocessors, digital signal processors (DSPs), application specific integrated circuits (ASIC), FPGA, gate level circuits and processors based on multi core processor architecture, as non-limiting examples.

Embodiments of the inventions may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

The foregoing description has provided by way of non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims. Indeed there is a further embodiment comprising a combination of one or more embodiments with any of the other embodiments previously discussed.

The invention claimed is:

1. An apparatus, comprising:
at least one processor; and
at least one memory including computer program code;
the at least one memory and the computer program code configured to, with the at least one processor, cause the apparatus at least to perform:
applying beam shape coefficients for obtaining a beam shape output for a linear part of a beam formed by an array of transmitters, each transmitter being associated with a respective transmit path comprising a respective power amplifier;
varying an output characteristics of at least one transmit path to increase nonlinear characteristics between the transmit paths to provide a beam shape for a non-linear part of the beam;
linearizing an output of the array of transmitters by determining linearization coefficients for the array of transmitters for digitally predistorting an input signal to the array of transmitters, and applying the linearization coefficients to the signal input to the array of transmitters; and
calibrating the transmitter array by measuring error distributions over at least two transmit paths, modifying the beam shape coefficients to better obtain the beam shapes subsequent to the linearization, and applying the modified beam shape coefficients to the array of transmitters.

2. The apparatus as claimed in claim 1, wherein the at least one memory and the computer program code are further configured to cause the apparatus to alternate between the linearizing and the calibrating until the beam shape, having a mixture of linear and non-linear components, is obtained.

3. The apparatus as claimed in claim 1, wherein the measuring the error distribution over at least two transmit paths comprises measuring any of a power distribution, an amplitude distribution, or an envelope distribution over the at least two transmit paths.

4. The apparatus as claimed in claim 1, wherein determining the linearization coefficients comprises obtaining time domain samples of the signals output by the array of transmitters.

5. The apparatus as claimed in claim 1, wherein the at least one memory and the computer program code are further configured to cause the apparatus to perform:
comparing the measured error distributions to a threshold value; and
alternating between the linearizing and the calibrating while the measured error distributions are above the threshold value.

6. The apparatus as claimed in claim 1, wherein the at least one memory and the computer program code are further configured to cause the apparatus to perform:
comparing the measured error distributions to a threshold value; and
performing the calibrating when the measured error distributions are above the threshold value; and
performing the linearizing when the measured error distributions are below the threshold value.

7. The apparatus as claimed in claim 1, wherein the at least one memory and the computer program code are further configured to cause the apparatus to perform:
providing the linearization coefficients to the calibrating; and
using the linearization coefficients for modifying the beam shape coefficients.

8. The apparatus as claimed in claim 1, wherein the at least one memory and the computer program code are further configured to cause the apparatus to perform altering the beam shape during the operation of the apparatus based on at least one of differences in nonlinearities between nonlinear transmit paths, interference level surrounding the apparatus, received signal power levels, movement of the apparatus relative to other apparatuses with which the apparatus is communicating, a determined quality level of a received signal, a direction of interference in a communicated signal, a direction of transmission or convergence speed associated with linearizing the output of the array of transmitters, and a direction of transmission or convergence speed associated with calibrating the transmitter array.

9. The apparatus as claimed in claim 1, wherein the at least one memory and the computer program code are further configured to cause the apparatus to perform:
determining the non-linear part of the beam by calculating any of an adjacent channel power, a total radiated adjacent channel power, a signal to noise ratio, and a signal to interference ratio.

10. The apparatus as claimed in claim 1, wherein the varying the nonlinear characteristics between the transmit paths is configured to modify the nonlinear characteristics by least one of altering the phase of a phase shifter in at least one transmit path, altering a gain of a variable gain amplifier in at least one transmit path, and biasing of a power amplifier in at least one transmit path.

11. A method, comprising:
applying beam shape coefficients for obtaining a beam shape output for a linear part of a beam formed by an array of transmitters, each transmitter being associated with a respective transmit path comprising a respective power amplifier;
varying an output characteristics of at least one transmit path to increase nonlinear characteristics between the transmit paths to provide a beam shape for a non-linear part of the beam;
linearizing an output of the array of transmitters by determining linearization coefficients for the array of transmitters for digitally predistorting an input signal to the array of transmitters, and applying the linearization coefficients to the signal input to the array of transmitters; and
calibrating the transmitter array by measuring error distributions over at least two transmit paths, modifying the beam shape coefficients to better obtain the beam shapes subsequent to the linearization, and applying the modified beam shape coefficients to the array of transmitters.

12. The method as claimed in claim 11, further comprising alternating between the linearizing and the calibrating until the beam shape, having a mixture of linear and non-linear components, is obtained.

13. The method as claimed in claim 11, further comprising:
comparing the measured error distributions to a threshold value; and
alternating between said linearizing and said calibrating while the measured error distributions are above the threshold value.

14. The method as claimed in claim 11, further comprising:
comparing the measured error distributions to a threshold value;
operating the calibrating when the measured error distributions are above the threshold value; and
operating the linearizing when the measured error distributions are below the threshold value.

15. A computer program embodied on a non-transitory computer-readable medium, said computer program comprising instructions for causing an apparatus to perform at least:
applying beam shape coefficients for obtaining a beam shape output for a linear part of a beam formed by an array of transmitters, each transmitter being associated with a respective transmit path comprising a respective power amplifier;
varying an output characteristics of at least one transmit path to increase nonlinear characteristics between the transmit paths to provide a beam shape for a non-linear part of the beam;
linearizing an output of the array of transmitters by determining linearization coefficients for the array of transmitters for digitally predistorting an input signal to the array of transmitters, and applying the linearization coefficients to the signal input to the array of transmitters, and
calibrating the transmitter array by measuring error distributions over at least two transmit paths, modifying the beam shape coefficients to better obtain the beam shapes subsequent to the linearization, and applying the modified beam shape coefficients to the array of transmitters.

* * * * *